US012526969B2

(12) United States Patent
Chauhan et al.

(10) Patent No.: US 12,526,969 B2
(45) Date of Patent: Jan. 13, 2026

(54) HIGH SPEED GRID ARRAY MODULE

(71) Applicant: Intel Corporation, Santa Clara, CA (US)

(72) Inventors: Shailendra Singh Chauhan, Bengaluru (IN); Raghavendra Rao, Bangalore (IN); Ranjul Balakrishnan, Bangalore (IN); Nizamuddin Shaik, Portland, OR (US); Bijendra Singh, Bangalore (IN); Siva Prasad Jangili Ganga, Bengaluru (IN); Dong-Ho Han, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 737 days.

(21) Appl. No.: 17/741,294

(22) Filed: May 10, 2022

(65) Prior Publication Data

US 2022/0272880 A1 Aug. 25, 2022

(51) Int. Cl.
*H05K 9/00* (2006.01)
*H01L 23/32* (2006.01)
*H01L 23/498* (2006.01)
*H01L 23/552* (2006.01)
*H01R 12/71* (2011.01)
*H05K 1/11* (2006.01)
*H05K 1/14* (2006.01)
*H05K 1/18* (2006.01)
(Continued)

(52) U.S. Cl.
CPC .......... *H05K 9/0028* (2013.01); *H01L 23/32* (2013.01); *H01L 23/49833* (2013.01); *H01L 23/552* (2013.01); *H01R 12/714* (2013.01); *H05K 1/111* (2013.01); *H05K 1/144* (2013.01); *H05K 1/181* (2013.01); *H05K 9/0015* (2013.01); *H01L 23/49816* (2013.01); *H01L 25/0655* (2013.01); *H01L 25/18* (2013.01); *H01R 12/58* (2013.01); *H01R 12/7047* (2013.01); *H05K 2201/09072* (2013.01); *H05K 2201/09409* (2013.01); *H05K 2201/10159* (2013.01); *H05K 2201/10371* (2013.01); *H05K 2201/10378* (2013.01); *H05K 2201/10409* (2013.01); *H05K 2201/10522* (2013.01); *H05K 2201/10734* (2013.01); *H05K 2201/10939* (2013.01)

(58) Field of Classification Search
CPC ...... H05K 9/0028; H05K 1/111; H01L 23/32; H01L 23/49833; H01L 23/552; H01R 12/714
USPC .......................................................... 361/704
See application file for complete search history.

(56) References Cited

U.S. PATENT DOCUMENTS 7,911,853 B2 3/2011 Kim
2008/0235939 A1* 10/2008 Hiew ..................... H05K 3/284
29/841

(Continued)

*Primary Examiner* — Zhengfu J Feng
(74) *Attorney, Agent, or Firm* — Compass IP Law PC

(57) ABSTRACT

A system board includes a module board that connects to the system board with an interposer having compressible connectors. The module board can further be covered by a shield that has a metal alloy having an element to provide good electrical conductivity and an element to provide structural integrity and heat transfer. The module board can further include gaskets to interconnect the shield to a ground plane of the module board. the interposer board can further include an extra column of ground connections to reduce signaling noise between the interposer board and the system board.

21 Claims, 9 Drawing Sheets

(51) Int. Cl.
    *H01L 25/065*     (2023.01)
    *H01L 25/18*      (2023.01)
    *H01R 12/58*      (2011.01)
    *H01R 12/70*      (2011.01)

(56) References Cited

U.S. PATENT DOCUMENTS

| | | | |
|---|---|---|---|
| 2011/0211310 A1* | 9/2011 | Farling | G06F 1/185 |
| | | | 361/748 |
| 2011/0286286 A1 | 11/2011 | Kim | |
| 2012/0064738 A1* | 3/2012 | Shelsky | G01R 31/2889 |
| | | | 439/65 |
| 2016/0041781 A1 | 2/2016 | Kaviani et al. | |
| 2019/0034365 A1 | 1/2019 | Lovelace et al. | |
| 2019/0362764 A1 | 11/2019 | Qawami et al. | |
| 2020/0389606 A1* | 12/2020 | Petilli | G05D 1/0289 |
| 2021/0321516 A1* | 10/2021 | Rao | H05K 1/111 |
| 2023/0282547 A1* | 9/2023 | Refai-Ahmed | H01L 23/562 |
| | | | 257/715 |

\* cited by examiner

HIGH SPEED GRID ARRAY MODULE

FIELD

Descriptions are generally related to interconnects, and more particular descriptions are related to modules that connect with grid arrays.

BACKGROUND

The number of processing units in computer systems, both servers and personal computers, continues to increase to meet processing demands. the processing units can include central processing unit (CPU) cores, graphics processing units (GPUs), and accelerators and special-purpose processors. More processing results in an increased demand for memory density and memory speed to supply the data for the compute operations.

System memory is typically included in a computer system in the form of a module board (such as a dual inline memory module (DIMM)) that connects to a system board, such as a motherboard. SODIMM (small outline DIMM) boards can be connected through edge connection of land grid array (LGA) connection. Increasing memory capacity, density, and communication bandwidth to provide data from the memory modules to the compute units has several issues. There are mechanical issues to provide high speed interconnection, electrical issues with electromagnetic interference (EMI) causes by high speed interconnections, and thermal issues resulting from high bandwidth access to devices with high memory density.

BRIEF DESCRIPTION OF THE DRAWING

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Descriptions of certain details and implementations follow, including non-limiting descriptions of the figures, which may depict some or all examples, and well as other potential implementations.

DETAILED DESCRIPTION

As described herein, a system board includes a module board that connects to the system board with an interposer having compressible connectors. The module board can further be covered by a shield that has a metal alloy having an element to provide good electrical conductivity and an element to provide structural integrity and heat transfer. The module board can further include gaskets to interconnect the shield to a ground plane of the module board. the interposer board can further include an extra row of ground connections to reduce signaling noise between the interposer board and the system board.

The interposer can be applied with a processing board, such as an accelerator module board, or a memory board. In one example, the interposer is a board used in a removable small outline dual inline memory module (SODIMM). The interposer board can be applied to make a land grid array (LGA) module. The addition of a shield or extra ground pins, or both a shield and extra ground pins, can provide improved module performance. The ground pins and the shield can provide electromagnetic interference (EMI) improvements, while the shield can provide mechanical and thermal improvements, and can also provide electrical improvements.

In one example, the module described can apply to a low power double data rate (LPDDR) memory module. In one example, the module can be applied to other double data rate (DDR) memory modules or graphics double data rate (GDDR) memory modules. In one example, the module can be applied to accelerator compute modules.

Figure 1:
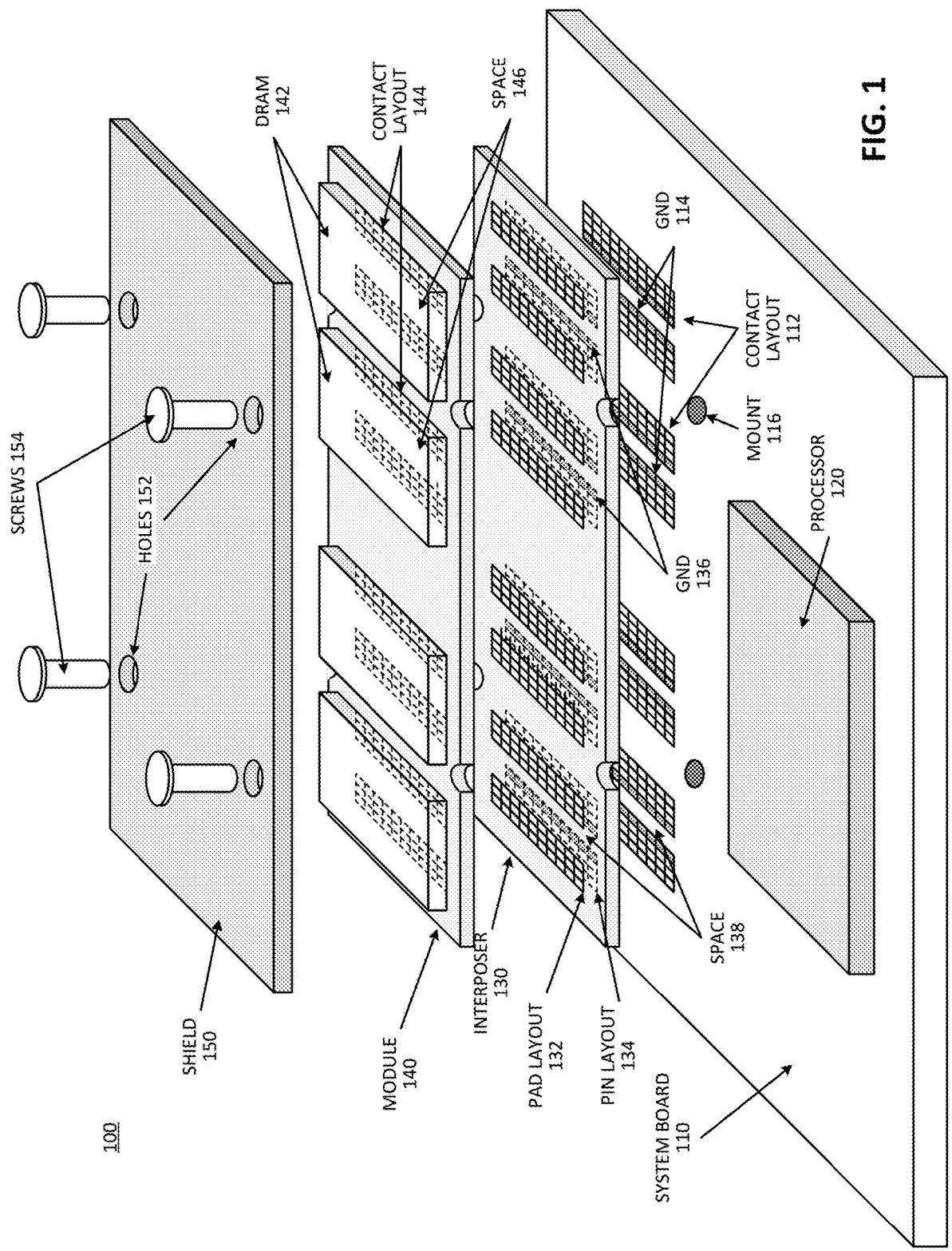
FIG. 1 is a block diagram of an example of a system in which a module is mounted to a system board with an interposer board.

FIG. 1 is a block diagram of an example of a system in which a module is mounted to a system board with an interposer board. The features of system 100 are to be understood as representative, and do not necessarily reflect the scale of a real system. In some instances, certain features are exaggerated for purposes of labeling or identification of the features. The layouts are also not necessarily reflective of an actual implementation (e.g., in terms of number of contacts), but are representative of the correspondence of contacts between different boards.

System 100 includes module 140 to interconnect with system board 110. Module 140 includes one or more components to interconnect with system board 110, and can thus be referred to as a component board. In one example, module 140 includes memory devices. System 100 specifically illustrates module 140 with dynamic random access memory (DRAM) devices, which can represent any of a wide variety of volatile system memory or graphics memory. Module 140 can be an alternative to a SODIMM module and provide memory for system board 110.

In one example, system board 110 represents a computer motherboard. System board includes processor 120 to execute system functions in system 100. Processor 120 can execute an operating system (OS) that controls the operation of system 100 or one or more applications that control the flow of operations and data in system 100. In one example, processor 120 represents a central processing unit (CPU). In one example, processor 120 represents a graphics processing unit (GPU). In one example, processor 120 represents a visual processing unit (VPU) or other artificial intelligence (AI) processing unit. Processor 120 can include one core or multiple cores.

In an implementation where module 140 represents a memory module, system 100 can provide high memory density and high memory speed for each compute unit of system board 110. The ability to provide high memory density and high memory speed enables system 100 to improve maximum multithreaded performance.

In one example, the printed circuit board (PCB) of module 140 is a carrier of memory devices of system 100, represented by DRAM devices 142. DRAM devices 142 can represent DRAM chips mounted on module 140. System 100 illustrates contact layout 144 of module 140 to represent the ball out or pin out of DRAM devices 142. As illustrated, contact layout 144 can represent a ball out of the PCB of module 140. The PCB ball array can match the ball layout for DRAM devices 142. In one example, the board or PCB of module 140 does not have any signal routing, but all ball on the underside of module 140 (the side that faces system board 110) can be through-hole connected to corresponding pins or balls on DRAM devices 142.

In one example, system 100 includes interposer 130, which represents an interposer connector board to enable a high speed connection of module 140 to system board 110, while also being removable. The removable nature of module 140 enables system 100 to be upgraded. For example, module 140 can be replaced with a new module in the case of failure or in the case of increasing to a higher-performance component.

In one example, interposer 130 represents a PCB with contacts on one side (the top side or top surface, which faces module 140) and contacts on the opposite side (the bottom side or bottom surface, which faces system board 110). Interposer 130 can also include direct through-hole correspondence between the contacts on the top side and the contacts on the bottom side, without routing of signals to different locations on the board or without changing the contact layout with respect to what is presented by module 140. Such routing can be referred to as passthrough routing. In one example, module 140 can have routing from its component side to its system board side, and interposer 130 will maintain the pinout of the system board side of module 140, presenting the same layout to system board 110 that module 140 would present if directly connected to the system board.

While directly connecting or soldering module 140 to system board 110 can provide a high-speed connection between system board 110 and module 140, such a configuration makes changing module 140 costly and difficult. Interposer 130 includes pad layout 132 on its module facing side to interface with contact layout 144 of module 140. Interposer 130 includes compression-based connectors on its system board facing side to interface with contact layout 112 of system board 110.

The compression-based connectors provide a secure electrical connection to system board 110 with a pin or flange that is mechanically compressed when secured to system board 110. In one example, module 140 includes compression-based connectors, which can remove the need for interposer 130. Thus, an implementation of system 100 can include system board 110, module 140, and shield 150, without a separate interposer 130. In one example, the compression-based connectors are implemented as conductive springs mounted to the system board facing side of interposer 130 or module 140.

System board 110 includes contact layout 112 which is a contact array to provide connection points for module 140. In one example, there will be no change in design for system board 110 between a memory-down configuration and a memory module configuration. Thus, contact layout 112 can match with the pin configuration of contact layout 144 of DRAM devices 142, allowing devices to be soldered directly to the system board, or to have module 140 mounted on the board.

Interposer can include pad layout 132 to represent the electrical connections for interposer 130 with module 140, and pin layout 134 to represent the electrical connections for interposer 130 with system board 110. The description of system 100 uses different terms for purposes of identification, where at least some of the terms can be used interchangeably. Use of pad layout, pad array, pin layout, pin array, contact layout, or contact array can all refer to an electrical connector or electrical connection point.

For purposes of identification, module 140 is described as having contact layout 144, which matches a pinout of one or more DRAM devices 142 or other component mounted on the module. Interposer 130 is described as having pad layout 132 to electrically interconnect with contact layout 144 of module 140. In one example, contact layout 144 represents ball of a ball grid array (BGA) or multiple BGAs and pad layout 132 represents exposed electrically conductive pads or contacts to interface with the BGA balls.

Interposer 130 is described as having pin layout 134 to electrically interconnect with contact layout 112 of system board 110. In one example, contact layout 112 represents exposed electrically conductive pads or contacts and pin layout represents pins or flanges to interface with the contacts on system board 110. Pin layout 134 represents compression-based contacts, which have a spring action to allow the board to compress in response to force applied through the securing of screws 154.

Reference to a layout matching or corresponding to another layout of connectors refers to the signal layout for the contacts. Thus, for a signal in one physical location of a layout on one board, the connector in the corresponding or matching physical location will carry the same signal.

System 100 includes shield 150 to press module 140 to system board 110. System 100 can include screws 154 to secure shield to module 140 and to system board 110. In an implementation where system 100 includes interposer 130, screws 154 secure module 140 to interposer 130, and secure module 140 and interposer 130 to system board 110. Screws 154 attached to mounts 116 on system board 110 through holes 152 of shield 150. Module 140 and interposer 130 can include holes (not shown in system 100) or can include notches along their edges to make room for screws 154.

In one example, mounts 116 represent nuts or other mechanisms that secure to screws 154 through the back side (the side opposite the side to which module 140 is mounted) of system board 110. Thus, mounts 116 can include holes in system board 110 with nuts or another threaded feature to secure to screws 154. In one example, mounts 116 can be part of or secured to a backplate, which is a plate on the back side of system board 110. In one example, mounts 116 are plated holes, electrically connecting screws 154 to a ground plane of system board 110.

Shield 150 can be referred to as a cover or a plate. Shield 150 can act as a mechanical stiffener for module 140, to press the module over interposer 130 or directly to system board 110. The mechanical operation of shield 150 can make the electrical connection of the compression-based contacts or connectors on interposer 130 or module 140. The preferred material for a mechanical plate is steel, which can support many Newtons of force. Shield 150 can be referred to as a removable shield, seeing that the shield is secured by a screw or other mechanical means to attach to the module, which can then be easily removed. In contrast, use of an adhesive or solder would not normally be considered as removable, seeing that the securing of the cover would be expected to remain in place without being removed.

However, the thermal properties of steel are poor, and a pure steel plate would negatively impact the performance of system 100 due to the trapping of heat at DRAM devices 142. In one example, shield 150 is a plate that has a metal alloy having a metal element that provides good mechanical properties and a metal element that has good thermal properties. An alloy of steel and copper can provide a module plate that has good rigidity for mechanical purposes, while having good thermal conductivity.

In one example, system 100 includes additional ground contacts, which can improve the electrical performance of system 100. As illustrated in system 100, DRAM devices 142 have a contact layout which includes multiple rows of contacts, represented by contact layout 144. There can be a gap between groups or arrays of the contacts, as illustrated by space 146. Thus, a single DRAM device 142 has two arrays of contacts, each array having multiple rows of multiple contacts each or multiple columns of multiple contacts each.

As illustrated, module 140 includes contact layout 144, which has space 146 between two groups of columns of contacts. Pad layout 132 of interposer 130 matches contact layout 144. In one example, pin layout 134 has an additional column (or row, depending on the orientation chosen) of ground contacts in the space between the two groups of columns of contacts. In one example, pin layout 134 includes an additional column of ground contacts per group or per array, thus having two extra columns in the space.

In system 100, the extra ground contacts are represented in a darker shade and are identified as ground (GND) 136. With the additional column or columns of ground contacts, space 146 is shrunk to space 138. Contact layout 112 includes corresponding ground contacts, also in a darker shade and identified as ground (GND) 114.

In an implementation of system 100 where pin layout 134 is part of module 140 and there is no interposer 130, module 140 can include top side contacts matching to the pinout of DRAM devices 142, and have pin layout 134 on the bottom side. In such an implementation, the component side or top side of module 140 can appear as pad layout 132 of interposer 130, with DRAM devices 142 directly adhered to the pads. The system board side or the bottom side can include compression-based pins with an extra row of ground ports, corresponding to ground 114.

Figure 2:
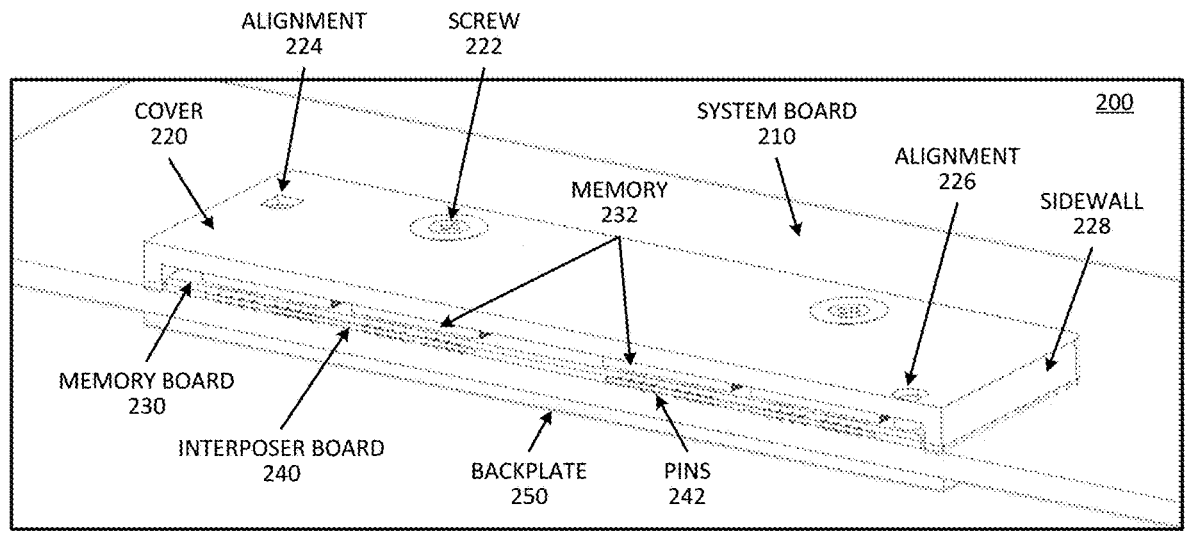
FIG. 2 is a cutaway view of an example of a memory module to connect to a system board with a connector array on the system board.

FIG. 2 is a cutaway view of an example of a memory module to connect to a system board with a connector array on the system board. Diagram 200 represents a perspective cutaway view of a system in accordance with an example of system 100.

Diagram 200 illustrates system board 210 with memory board 230 mounted on system board 210 through interposer board 240. Memory board 230 includes memory devices identified as memory 232 in diagram 200. Interposer board 240 includes pins 242, which represent compressible pins to electrically connect to system board 210. In one example, pins 242 include extra ground pins between interposer board 240 and system board 210, which can help suppress EMI radiation.

Diagram 200 illustrates cover 220, which represents a shield or plate to cover the memory module. The memory module includes memory board 230 with memory 232 and interposer board 240. Cover 220 secures to system board 210 with screws 222. In one example, the system of diagram 200 includes backplate 250, which can secure to the back of system board 210 with screws 222. In one example, cover 220 is made of an alloy that provides structural support as well as good thermal conductivity.

In one example, cover 220 includes one or more alignment holes or alignment features. Alignment 224 represents a first alignment feature and alignment 226 represents a second alignment feature. In one example, the alignment features are not symmetrically aligned (as depicted in diagram 200), to ensure proper alignment.

In one example, cover 220 includes sidewalls 228. Sidewalls 228 can provide a complete cover around the memory module. In one example, sidewalls 228 can be vented or meshed to allow airflow around the memory module. With sidewalls 228, cover 220 can provide good suppression of EMI caused by high speed communication signaling of memory 232. Alternatively, as described in more detail below, cover 220 can be electrically connected to memory board 230 with tabs or gasket features.

The system of diagram 200 can communicate at higher frequency than a traditional memory module. The thermal performance of cover 220 can enable higher sustained throughput from the memory module, improving performance. The increase in frequency can enable the memory module to operate at a higher speed bin (such as speed bins as defined in a memory standard). The higher speed bin refers to operation of the memory module at higher sustained communication frequency, with associated electrical and timing parameters defined for such operation.

The system of diagram 200 can have improved shielding effectiveness due to pins 242 including additional ground paths. The system can have improved shielding effectiveness due to a metal alloy that make for cover with good electrical properties. In one example, cover 220 is made up of an alloy of steel and copper, which can reduce radiation from the memory module.

In one example, changing the cover material to an alloy will not have a Z-height or vertical dimension impact on the system. The cover can be of the same or a comparable thickness to a cover that would otherwise be used in the system. The module geometry can this be the same as prior implementations. Additionally, adding a column or row of ground pins to pins 242 will not have an impact to the module geometry, but will provide improve signaling.

In one example, the system of diagram 200 has improved power saving. Improvements in shielding and signaling can reduce leakage power. Additionally, improved thermal performance can lower the module temperature, also reducing leakage power.

Figure 3:
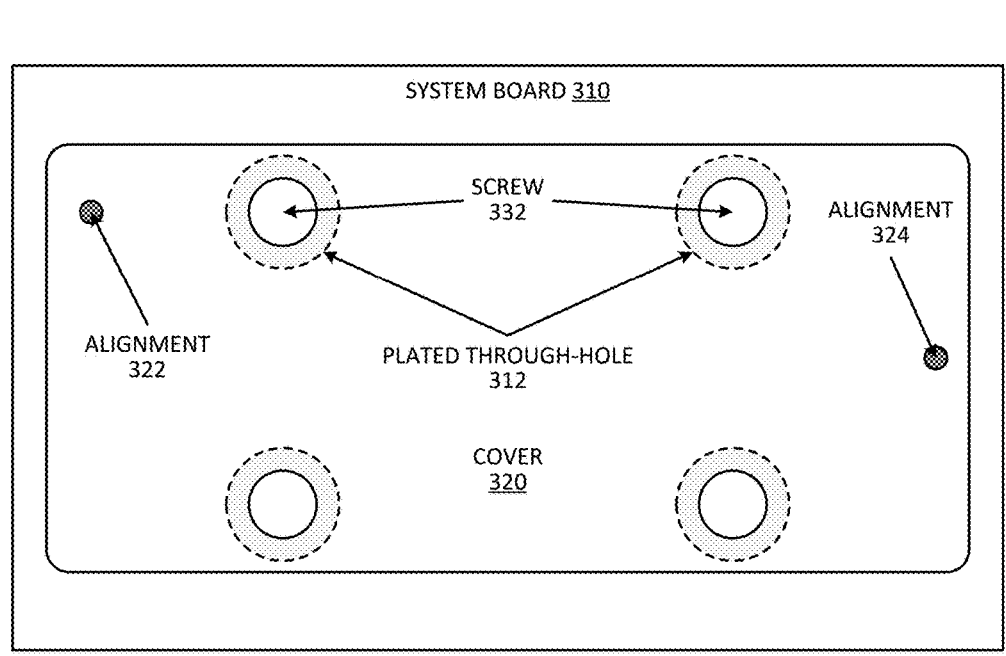
FIG. 3 is a top view of an example of a shield to mount a module board to a connector array of a system board.

FIG. 3 is a top view of an example of a shield to mount a module board to a connector array of a system board. System 300 illustrates a top view of an example of the system of diagram 200. System 300 can illustrate a top view of an example of system 100.

System 300 illustrates a portion of system board 310 on which a module will be mounted. The module can be a memory module, an accelerator module, a processing module, or other module. Cover 320 represents a plate or cover for the module.

In one example, cover 320 is made of a stiffener material to compress the stacked components of the module, which addressing both thermal and mechanical conditions for the system. In one example, cover 320 is made of a composite material to provide desired mechanical and thermal properties. In one example, cover 320 is made of a composite of steel to provide desired mechanical properties and copper to provide desired thermal properties. The alloy can include sufficient copper in the steel to reduce the device junction temperature by approximately 8-10 degrees Celsius.

System 300 illustrates cover 320 having screws that go through holes in cover 320 to plated through-holes 312. Plated through-holes 312 represent plated mounts in system board 310 to which screws 332 will secure. Plated through-holes or through-hole connections can connect to a ground plane of system board 310 to ground cover 320 to the system board ground.

System 300 illustrates alignment 322 and alignment 324, which represent alignment features for cover 320. The alignment can be alignment that aligns the connectors, pins, and contacts of the board or boards of the module with system board 310. In one example, system board 310 includes posts that extend through alignment holes in the module board(s) and through alignment holes in cover 320.

Figure 4A:
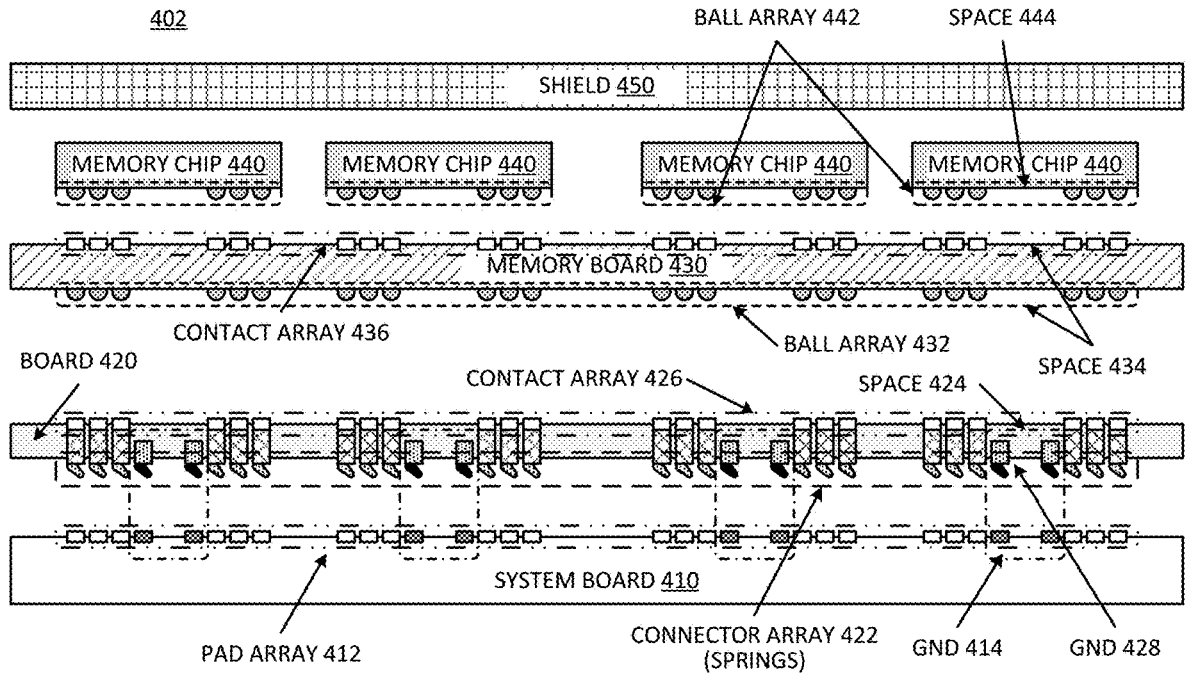
FIGS. 4A-4B are cutaway view diagrams of an example of a memory module to connect to a system board with a connector array on the module board.
Figure 4B:
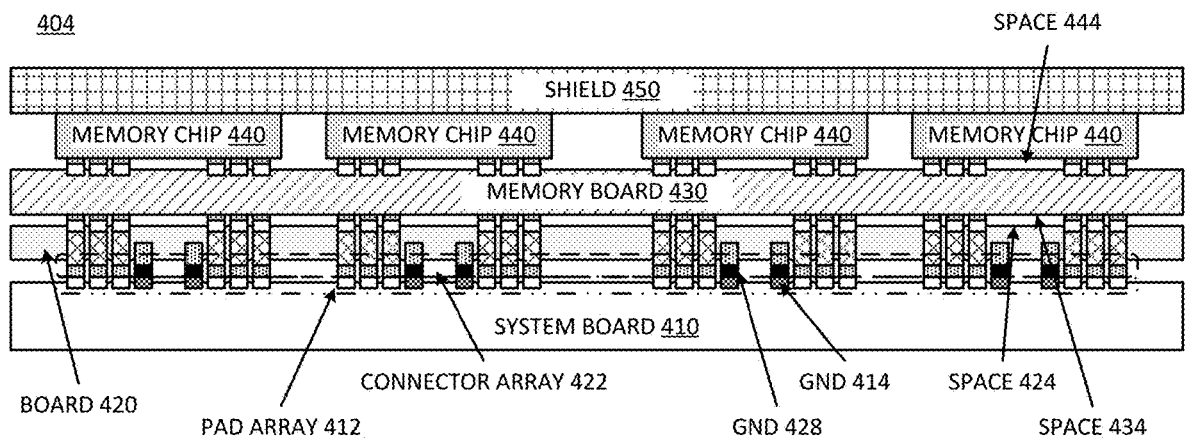

FIGS. 4A-4B are cutaway view diagrams of an example of a memory module to connect to a system board with a connector array on the module board.

FIG. 4A is a cutaway view of an example of a memory module to connect to a system board. The memory module provides one example, and other modules can implement the features related to the cover and the grounding as described.

System 402 illustrates a system in accordance with an example of system 100. System board 410 represents a system board or a motherboard. In one example, system board 410 includes pad array 412 on the surface of the board. Pad array 412 represents pads or connection points on system board 410. Pad array 412 has a layout that matches the connector array of the interposer board, when an interposer board is used, or the connector array of the bottom of the module board if an interposer board is not used.

System 402 includes memory board 430 on which memory chips 440 are mounted. Memory chips 440 represent an example of an integrated circuit component mounted on a module board. Memory chips 440 include ball array 442, which has a pinout or connector configuration that is typically defined by specification. Memory chips 440 mount to memory board 430 through contact array 436, which has a connector layout that matches the connector layout of the individual memory chips.

In one example, system 402 includes board 420, which represents an interposer or interface board. Board 420 includes connector array 422 on the surface that faces system board 410. Connector array 422 represents compression-based connectors, such as spring contacts. A compression-based connection array can be similar to a compression mechanism of an LGA (land grid array) socket or LGA package. In the initial configuration of system 402, connector array 424 has connectors that are extended.

In one example, board 420 includes contact array 426 on a top surface of board that faces memory board 430. Contact array 426 can have a connector configuration that matches the configuration of ball array 432 of memory board 430. Ball array 432 matches the layout of contact array 436 on memory board, which in turn matches the layout of ball array 442 of the individual memory chips. In one example, the layout of ball array 442 includes space 444 between two groups of columns of balls. In one example, memory board 430 includes corresponding space 434 on the top and bottom surfaces. Thus, contact array 436 can have space 434 in between groups of contacts, and ball array 432 can also have space between groups of balls.

In one example, contact array 426 of board 420 has a layout that corresponds to the layout of ball array 432, and thus has connectors that correspond individually to the ball layout of each ball array 442 of each memory chip 440. Thus, contact array 426 can have space 424 between groups of contacts, where space corresponds to space 434 and spaces 444.

In one example, pad array 412 has a connector configuration that matches the configuration of ball array 432, and also includes additional ground contacts. Thus, pad array 412 includes a pad corresponding to each ball of ball array 432, and thus to each ball of ball arrays 442. Pad array 412 has a layout that corresponds to connector array 422 of board 420, where connector array 422 also includes additional ground connectors. The additional ground connectors can be within the space between groups of contacts. System 402 illustrates ground (GND) 428 in connector array 422, which represents the additional ground contacts on board 420. System 402 illustrates ground (GND) 414 in pad array 412, which represents the additional ground contacts on system board 410. In one example, GND 428, or the additional ground connectors of board 420, electrically connect to a ground plane or to ground signals of board 420. In one example, GND 414, or the additional ground connectors of system board 410, electrically connect to a ground plane of the system board.

System 402 includes shield 450 as a cover, plate, or shield for the module that includes memory chips 440, memory board 430, and board 420. In one example, shield 450 is secured to system board 410 with screws (not specifically illustrated). Shield 450 can be a shield in accordance with any description herein. Shield 450 can have an alloy or composite material that provides good thermal conductivity while having good stiffness to support pressing connector array 422 against pad array 412 when mounted to system board 410.

FIG. 4B is a cutaway view of an example of a memory module to connect to a system board with a connector array on the memory module. System 404 illustrates an example of system 402. System 402 can be referred to as a pre-assembly and system 404 can be referred to as post-assembly.

In system 404, shield 450 is mounted to system board 410, covering memory chips 440 mounted to memory board 430, which is electrically connected to system board 410 through board 420. Connector array 422 is compressed as it is electrically connected to pad array 412. Pad array 412 includes GND 414 to electrically connect to GND 428 of connector array 422. System 404 illustrates space 444 between groups of contacts of memory chip 440, with corresponding space 434 in memory board 430, and corresponding space 424 on the module facing side of board 420. It will be observed that system board 410 and the system board facing side of board 420 have the additional ground contacts in the space.

Figure 4C:
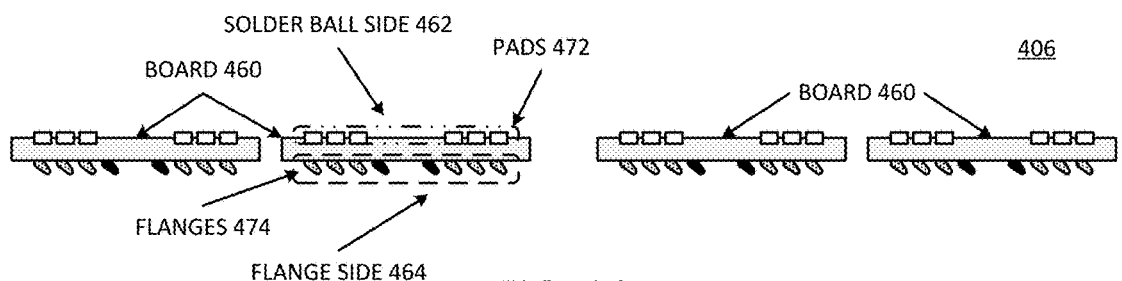
FIG. 4C is a cutaway view diagram of an example of an interposer arrangement to connect a module board to a system board.

FIG. 4C is a cutaway view diagram of an example of an interposer arrangement to connect a module board to a system board. System 406 illustrates an example of an interposer for a module, and can be an example of board 420 of system 402 and system 404.

System 406 illustrates multiple boards 460, where each board 460 can be a board specific to a component, such as memory chips 440 of system 402. In an alternate implementation, system 406 can include a single board 460 with contacts and flanges for multiple components, such as two or more memory chips 440 of system 402. Thus, there can be one or more boards 460, which can each support one or multiple components.

System 406 only illustrates details of one board 460. Board 460 has solder ball side 462 to which solder balls of a component will connect. Board 460 has flange side 464, which includes flanges 474 to electrically connect to contacts or connector pads of a system board. Solder ball side 462 can include pads 472, with a pad to correspond to each solder ball of the one or more components that will interconnect to board 460. Flange side 464 and solder ball side 462 represent PCB surfaces for board 460. In one example, flanges 474 include a flange for each of pads 472, and include another column or row of flanges for ground (represented as the dark flanges). The additional flanges for ground represent additional ground connectors, in accordance with any example herein.

Figure 5A:
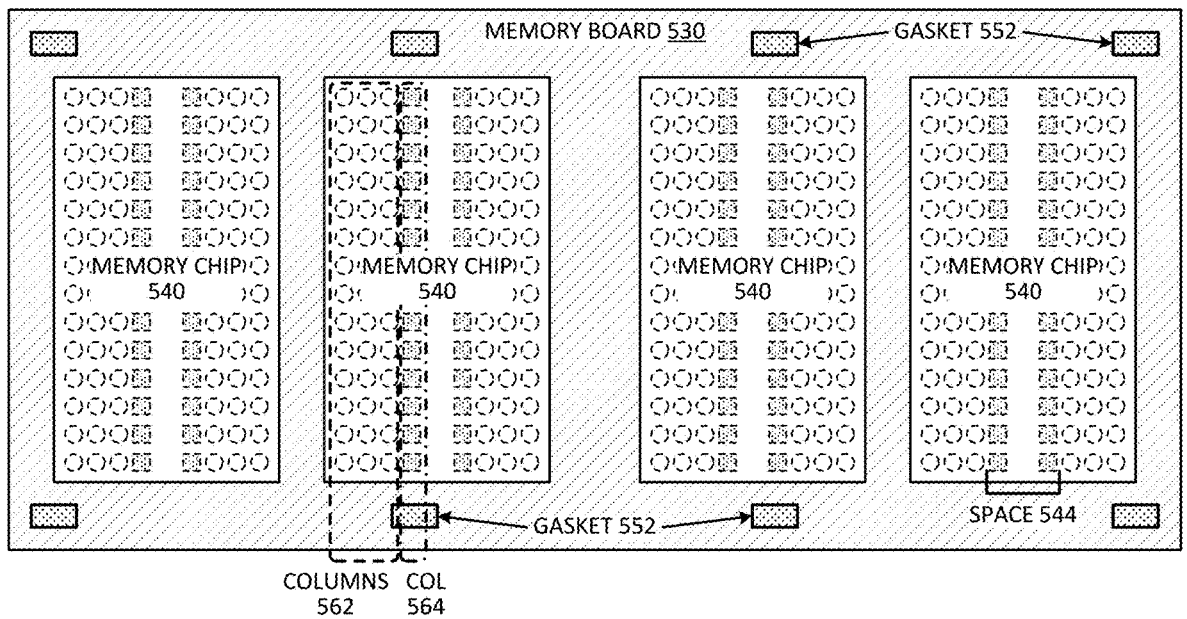
FIG. 5A is a top view of a memory board having grounding gaskets to electrically connect to a shield.

FIG. 5A is a top view of a memory board having grounding gaskets to electrically connect to a shield. System 502 illustrates a top view of a system in accordance with an example of system 100.

System 502 illustrates a module board. More specifically, system 502 illustrates a top of memory board 530, which represents a memory module board. Memory board 530 includes multiple memory chips 540 mounted on memory board 530. System 502 illustrates four devices, which is simply one example. The pinout of memory chips 540 are illustrated as the dashed circles, representing connector or contact positions for memory chips 540. It will be understood that the size and layout are for illustration only, and can be different for different implementations.

In one example, the connectors can be thought of as columns of contacts. Columns 562 represent a group of contacts corresponding to the pinout of memory chips 540. Column 564 represents an extra column of ground contacts that does not correspond to the pinout of memory chips 540. Space 544 represents the space between groups of columns 562 of memory chips 540. It can be observed that column 564 is within space 544.

In one example, system 502 includes gaskets 552, which represent tabs or other electrically conductive structures mounted to memory board 530. In one example, gaskets 552 are electrically connected to a ground plane of memory board 530. In one example, gaskets 552 represent surface mountable EMI gaskets mounted via solder reflow on exposed ground pads.

Connecting gaskets 552 to memory board ground and to an electrically conductive shield can reduce EMI from the module. In one example, the spacing of gaskets 552 around the perimeter of memory board 530 can be based on a wavelength of the anticipated EMI radiation, based on the communication speed of memory chips 540.

Figure 5B:
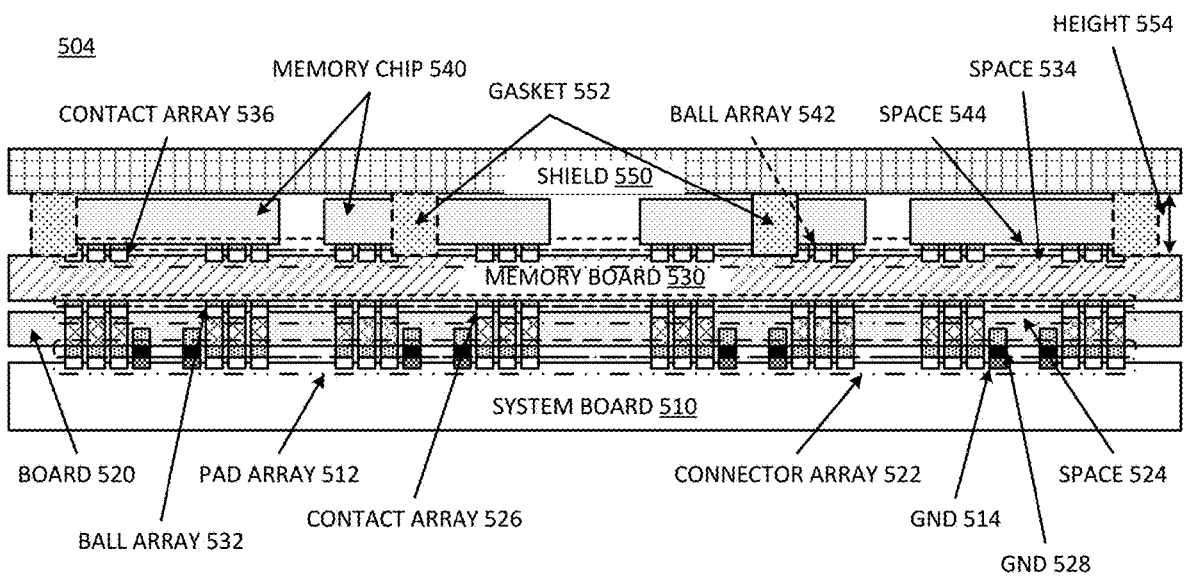
FIG. 5B is a cutaway view diagram of the memory board having grounding gaskets to electrically connect to the shield.

FIG. 5B is a cutaway view diagram of the memory board having grounding gaskets to electrically connect to the shield. System 504 illustrates an example of system 502.

System board 510 represents a system board or a motherboard. In one example, system board 510 includes pad array 512 on the surface of the board, which represents pads or connection points on system board 510. Pad array 512 has a layout that matches the connector array of the interposer board, when an interposer board is used, or the connector array of the bottom of the module board if an interposer board is not used.

System 504 includes memory board 530 on which memory chips 540 are mounted. Memory chips 540 include ball array 542, which has a pinout or connector configuration to mount to memory board 530 through contact array 536, which has a connector layout that matches the connector layout of the individual memory chips.

In one example, system 504 includes board 520, which represents an interposer or interface board. Board 520 includes connector array 522 on the surface that faces system board 510. Connector array 522 represents compression-based connectors, such as spring contacts.

In one example, board 520 includes contact array 526 on a top surface of board that faces memory board 530. Contact array 526 can have a connector configuration that matches the configuration of ball array 532 of memory board 530. Ball array 532 matches the layout of contact array 536 on memory board, which in turn matches the layout of ball array 542 of the individual memory chips. In one example, the layout of ball array 542 includes space 544 between two groups of columns of balls. In one example, memory board 530 includes corresponding space 534 on the top and bottom surfaces.

In one example, pad array 512 has a connector configuration that matches the configuration of ball array 532, and includes additional ground contacts. Pad array 512 has a layout that corresponds to connector array 522 of board 520, where connector array 522 also includes additional ground connectors. The additional ground connectors can be within the space between groups of contacts, as represented by space 524. System 504 illustrates ground (GND) 528 in connector array 522, which represents the additional ground contacts on board 520. System 504 illustrates ground (GND) 514 in pad array 512, which represents the additional ground contacts on system board 510.

System 504 includes shield 550 as a removable cover, plate, or shield for the module mounted to system board 510. Shield 550 can be a shield in accordance with any description herein. System 504 illustrates gaskets 552. While system 504 is a cutaway view, the view illustrates gaskets 552 to explicitly identify them in the diagram. Gaskets 552 have height 554 extending from memory board 530 to shield 550. In one example, height 554 is approximately equal to or approximately the same height as memory chips 540. Having approximately the same height can allow shield 550 to contact gaskets 552 for electrical conductivity as well as contacting or almost contacting memory chips 540 for good thermal performance. As a practical matter, height 554 of gaskets 552 can be slightly taller than the height of memory chips 540 to allow the use of thermal paste or other thermal transfer enhancement.

Figure 6A:
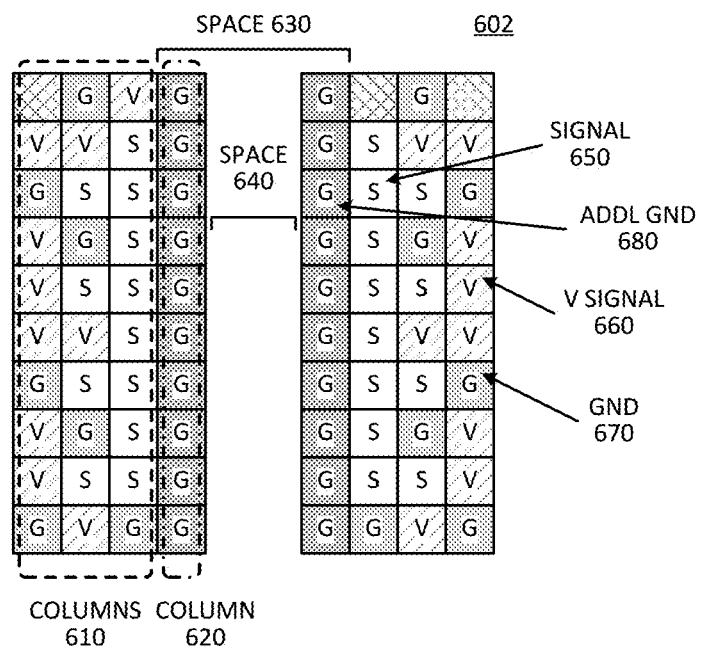
FIG. 6A is an example of pinout with extra ground ports.

FIG. 6A is an example of pinout with extra ground ports. Pinout 602 represents an example of a pinout for a connection between an interposer board or a module board and the system board. The pinout can also represent the pad layout on the system board. For purposes of pinout 602, 'G' refers to ground, such as a GND 670, 'V' refers to voltage, such as V signal 660, and 'S' refers to a communication signal, such as signal 650.

When an interposer board is used, the vertical transition of a signal increases, which can increase the likelihood of signal crosstalk. Consider signal 650. Without the column of additional ground pins, there would be no nearby return for signal 650. It can be observed that there are other signals that would likewise lack a close ground return.

Columns 610 represents the standard contacts for a component. Columns 610 include various combinations of voltage, ground, and signal contacts in accordance with the signal layout of the component. In one example, pinout 602 includes additional ground contacts in column 620. With column 620 of additional ground contacts, there is additional ground (ADDL GND) 680 next to signal 650. Thus, pinout 602 provides a better signal path for the signals of the component.

Space 630 represents the space between the columns of contacts for a component. Space 640 represents the space between the columns of contacts after addition of columns 620 of additional ground contacts.

In one example, the additional column of ground pins is combined with a top plate having a composite material that has good mechanical and thermal properties. Column 620 provide improved electrical properties. The use of a conductive tab connected to the top plate and the additional column of ground pins can provide good EMI radiation properties. The electrical properties can improve the speed bin by at least 1600 mbps (megabits per second) for a system having a 6400 mbps reference. The speed bin increase can be even greater, enabling a 3-4 speed bin increase.

Figure 6B:
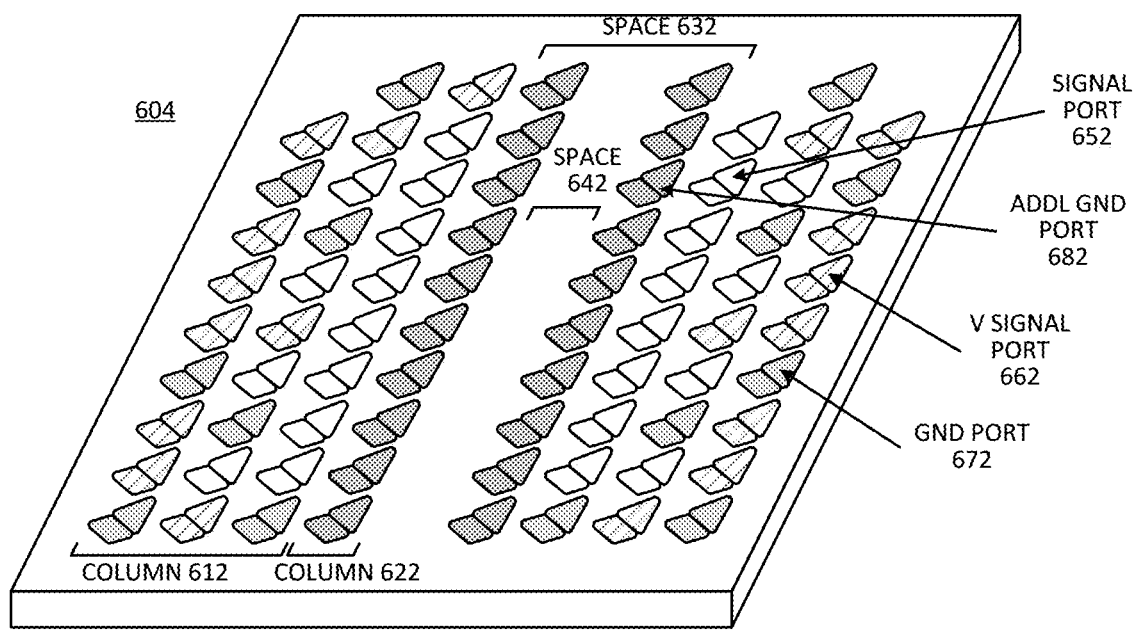
FIG. 6B is an example of the pinout with extra ground ports implemented with compression-based connectors on an interposer board.

FIG. 6B is an example of the pinout with extra ground ports implemented with compression-based connectors on an interposer board. Circuit 604 represents an implementation of pinout 602.

Circuit 604 illustrates flanges or springs or other compression-based contacts. While the layout of circuit 604 is the same as that of pinout 602, it will be understood that if pinout 602 represents a "top-down" view of the pinout, the layout of circuit 604 would be the mirror image of the pinout. For purposes of circuit 604, it will be assumed that pinout 602 represents the orientation of the compression-based connectors.

Circuit 604 illustrates columns 612, which include columns of ground, voltage, and signal contacts. Column 622 represents a column of additional ground connectors. Space 632 is reduced to space 642 with the addition of column 622 with the additional ground connectors.

V signal port 662 represents a voltage signal connector. GND port 672 represents a ground signal connector. Signal port 652 represents a communication signal connector. Additional ground (ADDL GND) port 682 represents an additional ground connector that provides a close return path for signal port 652.

Figure 7:
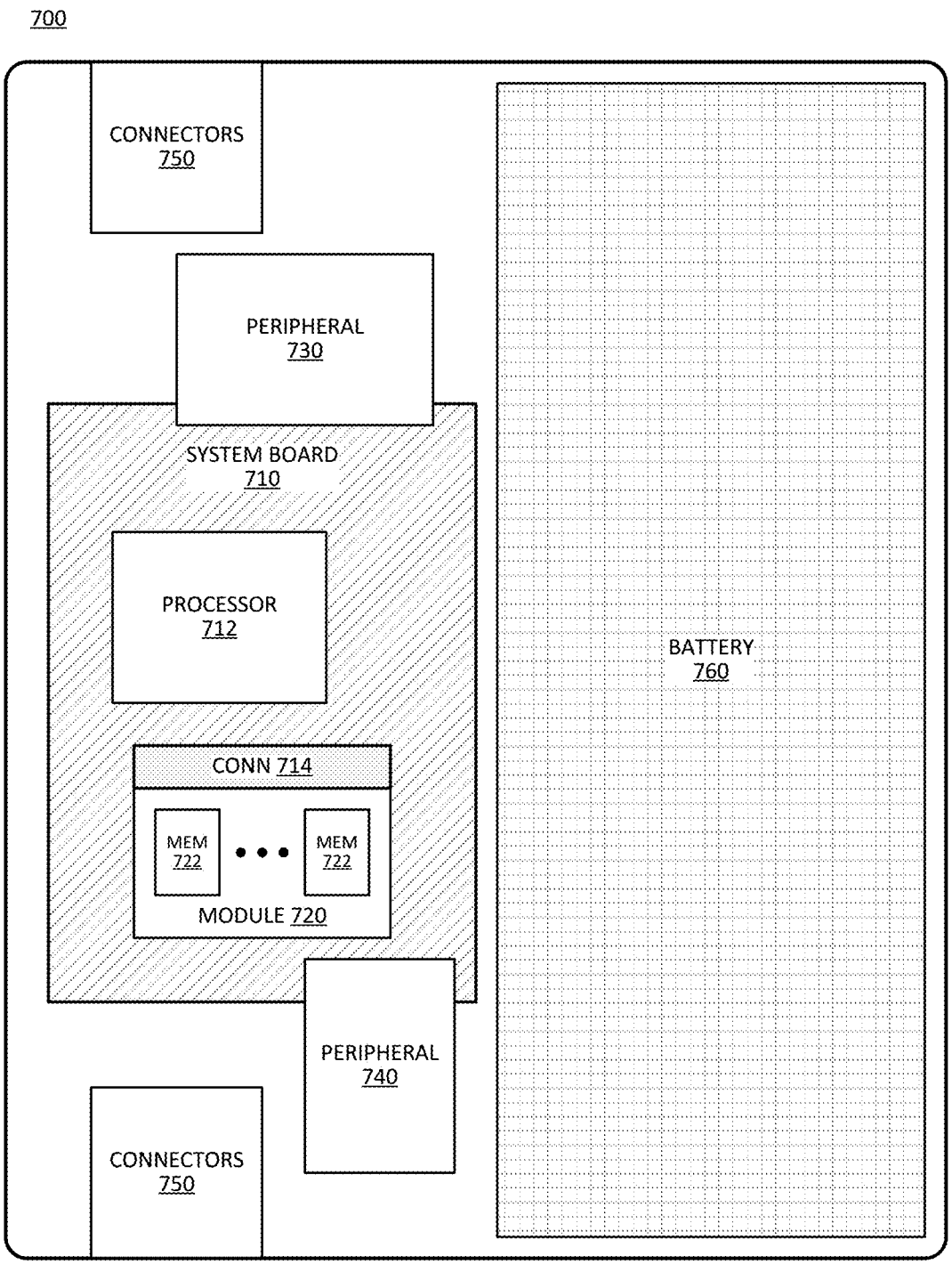
FIG. 7 is a block diagram of an example of a computer system with a memory module connector to mount to a planar system board.

FIG. 7 is a block diagram of an example of a computer system with a memory module connector to mount to a planar system board. System 700 represents a computing system or a computing device. For example, system 700 can be a laptop computer, a tablet computer, a smart phone or other handheld electronic device, or a two-in-one device. The display for the device is not explicitly shown in system 700, but can be a screen that covers device, or can be a display that connects via hinge, built on top of the chassis of system 700, or connect with some other connector (not shown).

In one example, system 700 has a clamshell design, where the processing elements and keyboard are fixed to the display element. In one example, system 700 is a detachable computer, where the processor and display are part of a common unit has a detachable keyboard.

System 700 includes system board 710, which represents a primary PCB to control the operation in system 700. System board 710 can be referred to as a motherboard in certain computer configurations. System board 710 represents a rectangular system board, which is a traditional system board configuration, with a length and a width (x and y axis, not specifically labeled for orientation in system 700).

System board 710 includes processor 712, which represents a host processor or main processing unit for system 700. Processor 712 can be a central processing unit (CPU) or system on a chip (SOC) that includes a CPU or other processor. In one example, processor 712 can include a graphics processing unit (GPU), which can be the same as the primary processor, or separate from the primary processor.

System board 710 includes operational memory or system memory for the computing device. The operational memory generally is, or includes, volatile memory, which has indeterminate state if power is interrupted to the memory. In one example, system 700 includes memory provided by module 720. Module 720 illustrates a module that includes multiple memory devices or memory chips, represented by memory (MEM) 722. Module 720 can be a memory module in accordance with any example herein, such system 100 or system 402 or system 504.

Module 720 interconnects with system board 710 via a connector array that has a connector layout that matches the pin layout of memory 722. Module 720 can alternatively be a different module with memory components or non-memory components, or both memory and non-memory components. Connector (CONN) 714 represents the interconnection between module 720 and system board 710. In one example, connector 714 represents an array of micro-springs to connect with system board 710. In one example, the micro-springs include additional ground contacts to provide return paths for signal contacts. In one example, module 720 includes a top plate that has a composite material that provides stiffness and good thermal conductivity.

System 700 includes one or more peripherals connected to system board 710. Peripheral 730 and peripheral 740 represent different peripherals that could be included in system 700. The size and number of the peripherals can be different in different system configurations. In one example, system 700 includes a solid state drive (SSD) as a peripheral device. In one example, system 700 includes a computation accelerator as a peripheral device. In one example, system 700 includes a wireless communication module or other network interface. A wireless communication module can be or include WiFi, Bluetooth (BT), WWAN (wireless wide area network) such as cellular, or other wireless communication.

System 700 includes connectors 750, which represent I/O (input/output) connectors to devices external to system 700. For example, connectors 750 can be or include USB (universal serial bus) connectors, video connectors such as HDMI (high definition media interface), company-proprietary connectors, or other I/O connectors.

System 700 includes battery 760 to power the system. In one example, system board 710 at least partially overlaps battery 760. It will be understood that the relative size, spacing, and location of components will be different depending on what type of system is implemented for system 700. The size and layout of system 700 is not necessarily intended to be typical or representative of each possible implementation, but illustrates possible components for such an implementation.

Figure 8:
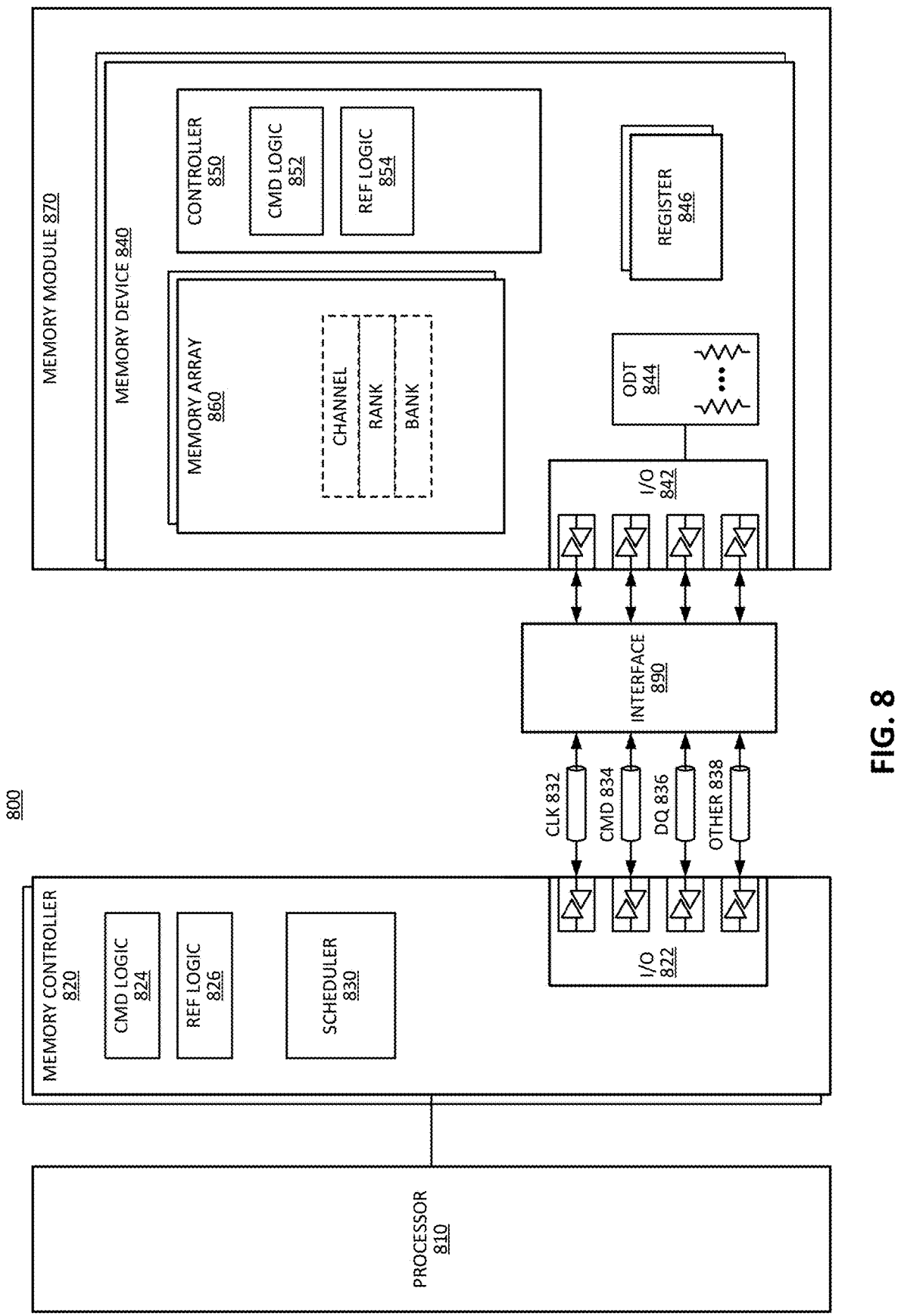
FIG. 8 is a block diagram of an example of a memory subsystem in which a memory module interface can be implemented.

FIG. 8 is a block diagram of an example of a memory subsystem in which a memory module interface can be implemented. System 800 includes a processor and elements of a memory subsystem in a computing device. System 800 can include memory module 870, which can be a memory module in accordance with any example herein, such system 100 or system 402 or system 504.

In one example, system 800 includes interface 890 to interconnect memory module 870 that holds memory devices 840 with memory controller 820. Memory controller 820 is disposed on a system board that includes pins, pads, or connectors to connect with memory module 870 through interface 890. Interface 890 represents an interconnection between memory and a system board in accordance with any example herein. In one example, interface 890 represents an array of micro-springs to connect with the system board. In one example, the micro-springs include additional ground contacts to provide return paths for signal contacts. In one example, memory module 870 includes a top plate that has a composite material that provides stiffness and good thermal conductivity.

Processor 810 represents a processing unit of a computing platform that may execute an operating system (OS) and applications, which can collectively be referred to as the host or the user of the memory. The OS and applications execute operations that result in memory accesses. Processor 810 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processor via a bus (e.g., PCI express), or a combination. System 800 can be implemented as an SOC (system on a chip), or be implemented with standalone components.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random-access memory), or some variant such as synchronous DRAM (SDRAM). A memory subsystem as described herein may be compatible with a number of memory technologies, such as DDR4 (double data rate version 4, JESD79-4, originally published in September 2012 by JEDEC (Joint Electron Device Engineering Council, now the JEDEC Solid State Technology Association), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235A, originally published by JEDEC in November 2015), DDR5 (DDR version 5, originally published by JEDEC in July 2020), LPDDR5 (LPDDR version 5, JESD209-5, originally published by JEDEC in February 2019), HBM2 ((HBM version 2), currently in discussion by JEDEC), or others or combinations of memory technologies, and technologies based on derivatives or extensions of such specifications.

Memory controller 820 represents one or more memory controller circuits or devices for system 800. Memory controller 820 represents control logic that generates memory access commands in response to the execution of operations by processor 810. Memory controller 820 accesses one or more memory devices 840. Memory devices 840 can be DRAM devices in accordance with any referred to above. In one example, memory devices 840 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 820 manages a separate memory channel, although system 800 can be configured to have multiple channels managed by a single controller, or to have multiple controllers on a single channel. In one example, memory controller 820 is part of host processor 810, such as logic implemented on the same die or implemented in the same package space as the processor.

Memory controller 820 includes I/O interface logic 822 to couple to a memory bus, such as a memory channel as referred to above. I/O interface logic 822 (as well as I/O interface logic 842 of memory device 840) can include pins, pads, connectors, signal lines, traces, or wires, or other hardware to connect the devices, or a combination of these. I/O interface logic 822 can include a hardware interface. As illustrated, I/O interface logic 822 includes at least drivers/transceivers for signal lines. Commonly, wires within an integrated circuit interface couple with a pad, pin, or connector to interface signal lines or traces or other wires between devices. I/O interface logic 822 can include drivers, receivers, transceivers, or termination, or other circuitry or combinations of circuitry to exchange signals on the signal lines between the devices. The exchange of signals includes at least one of transmit or receive. While shown as coupling I/O 822 from memory controller 820 to I/O 842 of memory device 840, it will be understood that in an implementation of system 800 where groups of memory devices 840 are accessed in parallel, multiple memory devices can include I/O interfaces to the same interface of memory controller 820. In an implementation of system 800 including one or more memory modules 870, I/O 842 can include interface hardware of the memory module in addition to interface hardware on the memory device itself. Other memory controllers 820 will include separate interfaces to other memory devices 840.

The bus between memory controller 820 and memory devices 840 can be implemented as multiple signal lines coupling memory controller 820 to memory devices 840. The bus may typically include at least clock (CLK) 832, command/address (CMD) 834, and write data (DQ) and read data (DQ) 836, and zero or more other signal lines 838. In one example, a bus or connection between memory controller 820 and memory can be referred to as a memory bus. In one example, the memory bus is a multi-drop bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 800 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 820 and memory devices 840. An example of a serial bus technology is 86106 encoding and transmission of high-speed data with embedded clock over a single differential pair of signals in each direction. In one example, CMD 834 represents signal lines shared in parallel with multiple memory devices. In one example, multiple memory devices share encoding command signal lines of CMD 834, and each has a separate chip select (CS_n) signal line to select individual memory devices.

It will be understood that in the example of system 800, the bus between memory controller 820 and memory devices 840 includes a subsidiary command bus CMD 834 and a subsidiary bus to carry the write and read data, DQ 836. In one example, the data bus can include bidirectional lines for read data and for write/command data. In another example, the subsidiary bus DQ 836 can include unidirectional write signal lines for write and data from the host to memory, and can include unidirectional lines for read data from the memory to the host. In accordance with the chosen memory technology and system design, other signals 838 may accompany a bus or sub bus, such as strobe lines DQS. Based on design of system 800, or implementation if a design supports multiple implementations, the data bus can have more or less bandwidth per memory device 840. For example, the data bus can support memory devices that have either a ×4 interface, a ×8 interface, a ×16 interface, or other interface. The convention "xW," where W is an integer that refers to an interface size or width of the interface of memory device 840, which represents a number of signal lines to exchange data with memory controller 820. The interface size of the memory devices is a controlling factor on how many memory devices can be used concurrently per channel in system 800 or coupled in parallel to the same signal lines. In one example, high bandwidth memory devices, wide interface devices, or stacked memory configurations, or combinations, can enable wider interfaces, such as a ×128 interface, a ×256 interface, a ×512 interface, a ×1024 interface, or other data bus interface width.

In one example, memory devices 840 and memory controller 820 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length eight (BL8), and each memory device 840 can transfer data on each UI. Thus, a ×8 memory device operating on BL8 can transfer 64 bits of data (8 data signal lines times 8 data bits transferred per line over the burst). It will be understood that this simple example is merely an illustration and is not limiting.

Memory devices 840 represent memory resources for system 800. In one example, each memory device 840 is a separate memory die. In one example, each memory device 840 can interface with multiple (e.g., 2) channels per device or die. Each memory device 840 includes I/O interface logic 842, which has a bandwidth determined by the implementation of the device (e.g., ×16 or ×8 or some other interface bandwidth). I/O interface logic 842 enables the memory devices to interface with memory controller 820. I/O interface logic 842 can include a hardware interface, and can be in accordance with I/O 822 of memory controller, but at the memory device end. In one example, multiple memory devices 840 are connected in parallel to the same command and data buses. In another example, multiple memory devices 840 are connected in parallel to the same command bus, and are connected to different data buses. For example, system 800 can be configured with multiple memory devices 840 coupled in parallel, with each memory device responding to a command, and accessing memory resources 860 internal to each. For a Write operation, an individual memory device 840 can write a portion of the overall data word, and for a Read operation, an individual memory device 840 can fetch a portion of the overall data word. The remaining bits of the word will be provided or received by other memory devices in parallel.

In one example, memory devices 840 are disposed directly on a motherboard or host system platform (e.g., a PCB (printed circuit board) on which processor 810 is disposed) of a computing device. In one example, memory devices 840 can be organized into memory modules 870. In one example, memory modules 870 represent dual inline memory modules (DIMMs). In one example, memory modules 870 represent other organization of multiple memory devices to share at least a portion of access or control circuitry, which can be a separate circuit, a separate device, or a separate board from the host system platform. Memory modules 870 can include multiple memory devices 840, and the memory modules can include support for multiple separate channels to the included memory devices disposed on them. In another example, memory devices 840 may be incorporated into the same package as memory controller 820, such as by techniques such as multi-chip-module (MCM), package-on-package, through-silicon via (TSV), or other techniques or combinations. Similarly, in one example, multiple memory devices 840 may be incorporated into memory modules 870, which themselves may be incorporated into the same package as memory controller 820. It will be appreciated that for these and other implementations, memory controller 820 may be part of host processor 810.

Memory devices 840 each include one or more memory arrays 860. Memory array 860 represents addressable memory locations or storage locations for data. Typically, memory array 860 is managed as rows of data, accessed via wordline (rows) and bitline (individual bits within a row) control. Memory array 860 can be organized as separate channels, ranks, and banks of memory. Channels may refer to independent control paths to storage locations within memory devices 840. Ranks may refer to common locations across multiple memory devices (e.g., same row addresses within different devices) in parallel. Banks may refer to sub-arrays of memory locations within a memory device 840. In one example, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one example, memory devices 840 include one or more registers 844. Register 844 represents one or more storage devices or storage locations that provide configuration or settings for the operation of the memory device. In one example, register 844 can provide a storage location for memory device 840 to store data for access by memory controller 820 as part of a control or management operation. In one example, register 844 includes one or more Mode Registers. In one example, register 844 includes one or more multipurpose registers. The configuration of locations within register 844 can configure memory device 840 to operate in different "modes," where command information can trigger different operations within memory device 840 based on the mode. Additionally or in the alternative, different modes can also trigger different operation from address information or other signal lines depending on the mode. Settings of register 844 can indicate configuration for I/O settings (e.g., timing, termination or ODT (on-die termination) 846, driver configuration, or other I/O settings).

In one example, memory device 840 includes ODT 846 as part of the interface hardware associated with I/O 842. ODT 846 can be configured as mentioned above, and provide settings for impedance to be applied to the interface to specified signal lines. In one example, ODT 846 is applied to DQ signal lines. In one example, ODT 846 is applied to command signal lines. In one example, ODT 846 is applied to address signal lines. In one example, ODT 846 can be applied to any combination of the preceding. The ODT settings can be changed based on whether a memory device is a selected target of an access operation or a non-target device. ODT 846 settings can affect the timing and reflections of signaling on the terminated lines. Careful control over ODT 846 can enable higher-speed operation with improved matching of applied impedance and loading. ODT 846 can be applied to specific signal lines of I/O interface 842, 822 (for example, ODT for DQ lines or ODT for CA lines), and is not necessarily applied to all signal lines.

Memory device 840 includes controller 850, which represents control logic within the memory device to control internal operations within the memory device. For example, controller 850 decodes commands sent by memory controller 820 and generates internal operations to execute or satisfy the commands. Controller 850 can be referred to as an internal controller, and is separate from memory controller 820 of the host. Controller 850 can determine what mode is selected based on register 844, and configure the internal execution of operations for access to memory resources 860 or other operations based on the selected mode. Controller 850 generates control signals to control the routing of bits within memory device 840 to provide a proper interface for the selected mode and direct a command to the proper memory locations or addresses. Controller 850 includes command logic 852, which can decode command encoding received on command and address signal lines. Thus, command logic 852 can be or include a command decoder. With command logic 852, memory device can identify commands and generate internal operations to execute requested commands.

Referring again to memory controller 820, memory controller 820 includes command (CMD) logic 824, which represents logic or circuitry to generate commands to send to memory devices 840. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 840, memory controller 820 can issue commands via I/O 822 to cause memory device 840 to execute the commands. In one example, controller 850 of memory device 840 receives and decodes command and address information received via I/O 842 from memory controller 820. Based on the received command and address information, controller 850 can control the timing of operations of the logic and circuitry within memory device 840 to execute the commands. Controller 850 is responsible for compliance with standards or specifications within memory device 840, such as timing and signaling requirements. Memory controller 820 can implement compliance with standards or specifications by access scheduling and control.

Memory controller 820 includes scheduler 830, which represents logic or circuitry to generate and order transactions to send to memory device 840. From one perspective, the primary function of memory controller 820 could be said to schedule memory access and other transactions to memory device 840. Such scheduling can include generating the transactions themselves to implement the requests for data by processor 810 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 820 typically includes logic such as scheduler 830 to allow selection and ordering of transactions to improve performance of system 800. Thus, memory controller 820 can select which of the outstanding transactions should be sent to memory device 840 in which order, which is typically achieved with logic much more complex that a simple first-in first-out algorithm. Memory controller 820 manages the transmission of the transactions to memory device 840, and manages the timing associated with the transaction. In one example, transactions have deterministic timing, which can be managed by memory controller 820 and used in determining how to schedule the transactions with scheduler 830.

In one example, memory controller 820 includes refresh (REF) logic 826. Refresh logic 826 can be used for memory resources that are volatile and need to be refreshed to retain a deterministic state. In one example, refresh logic 826 indicates a location for refresh, and a type of refresh to perform. Refresh logic 826 can trigger self-refresh within memory device 840, or execute external refreshes which can be referred to as auto refresh commands) by sending refresh commands, or a combination. In one example, controller 850 within memory device 840 includes refresh logic 854 to apply refresh within memory device 840. In one example, refresh logic 854 generates internal operations to perform refresh in accordance with an external refresh received from memory controller 820. Refresh logic 854 can determine if a refresh is directed to memory device 840, and what memory resources 860 to refresh in response to the command.

Figure 9:
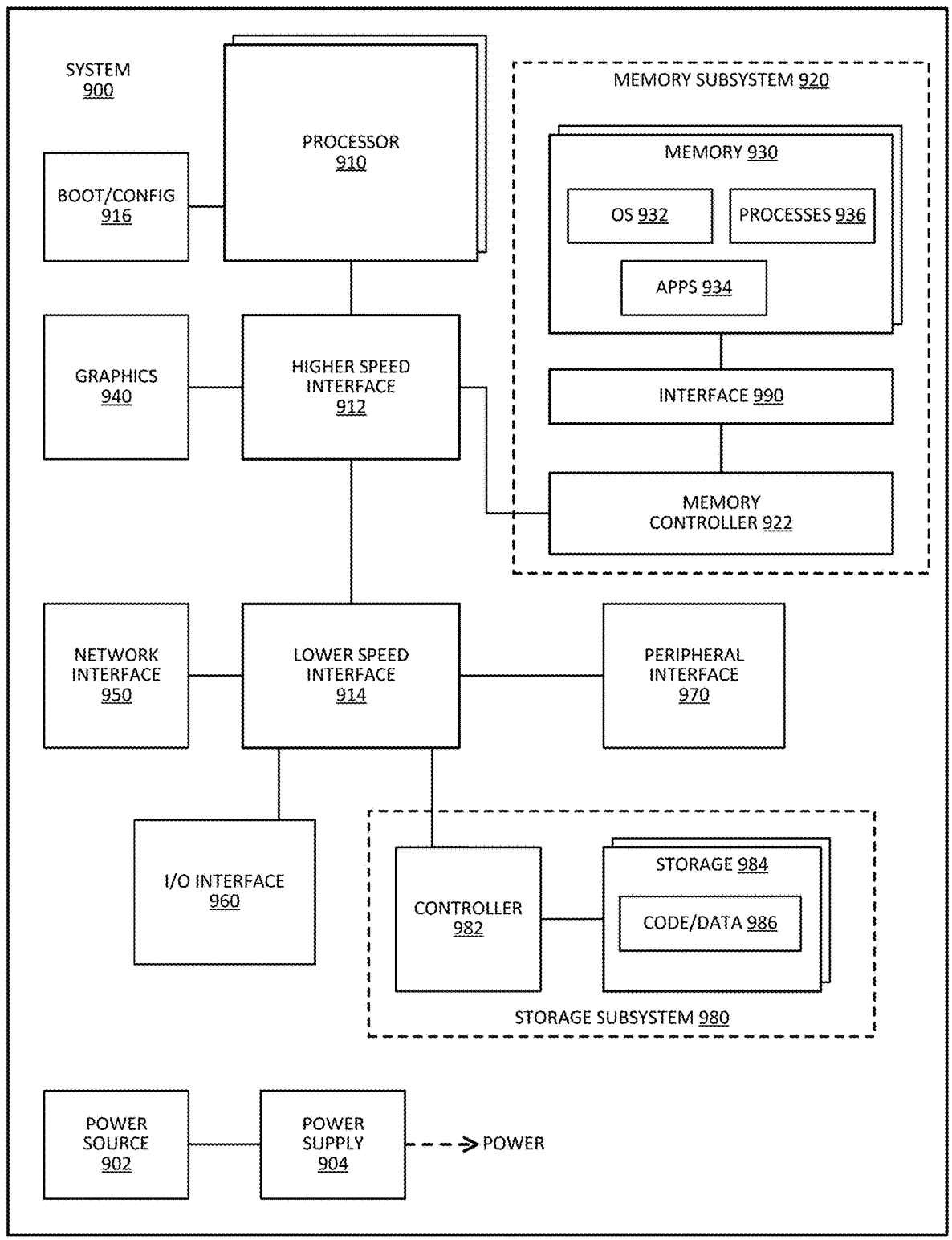
FIG. 9 is a block diagram of an example of a computing system in which a memory module interface can be implemented.

FIG. 9 is a block diagram of an example of a computing system in which a memory module interface can be implemented. System 900 represents a computing device in accordance with any example herein, and can be a laptop computer, a desktop computer, a tablet computer, a server, a gaming or entertainment control system, embedded computing device, or other electronic device. System 900 can include a memory module which holds memory 930, which can be a module in accordance with any example herein, such system 100 or system 402 or system 504.

In one example, system 900 includes interface 990 to interconnect a module that holds memory 930 with memory controller 922. Memory controller 922 is disposed on a system board that includes pins, pads, or connectors to connect with memory through interface 990. Such a module with such an interface can be applied to other peripheral components of system 900, to interconnect them to the system board. Interface 990 represents an interconnection between a module and a system board in accordance with any example herein. In one example, interface 990 represents an array of micro-springs to connect with the system board. In one example, the micro-springs include additional ground contacts to provide return paths for signal contacts. In one example, the module includes a top plate that has a composite material that provides stiffness and good thermal conductivity.

In one example, system 900 includes interface 990 to interconnect a memory module that holds memory 930 with memory controller 922. Memory controller 922 is disposed on a system board that includes pins, pads, or connectors to connect with memory 930. Interface 990 represents an interconnection between memory 930 and a system board in accordance with any example herein. In one example, interface 990 represents connectors on the system board to interconnect with pads on a memory module of memory 930. In one example, interface 990 represents connectors on a memory module of memory 930 to interconnect with the system board. In one example, interface 990 represents a connector to interconnect with pads on the system board and with pads on a memory module of memory 930.

System 900 includes processor 910 can include any type of microprocessor, central processing unit (CPU), graphics processing unit (GPU), processing core, or other processing hardware, or a combination, to provide processing or execution of instructions for system 900. Processor 910 can be a host processor device. Processor 910 controls the overall operation of system 900, and can be or include, one or more programmable general-purpose or special-purpose microprocessors, digital signal processors (DSPs), programmable controllers, application specific integrated circuits (ASICs), programmable logic devices (PLDs), or a combination of such devices.

System 900 includes boot/config 916, which represents storage to store boot code (e.g., basic input/output system (BIOS)), configuration settings, security hardware (e.g., trusted platform module (TPM)), or other system level hardware that operates outside of a host OS. Boot/config 916 can include a nonvolatile storage device, such as read-only memory (ROM), flash memory, or other memory devices.

In one example, system 900 includes interface 912 coupled to processor 910, which can represent a higher speed interface or a high throughput interface for system components that need higher bandwidth connections, such as memory subsystem 920 or graphics interface components 940. Interface 912 represents an interface circuit, which can be a standalone component or integrated onto a processor die. Interface 912 can be integrated as a circuit onto the processor die or integrated as a component on a system on a chip. Where present, graphics interface 940 interfaces to graphics components for providing a visual display to a user of system 900. Graphics interface 940 can be a standalone component or integrated onto the processor die or system on a chip. In one example, graphics interface 940 can drive a high definition (HD) display or ultra high definition (UHD) display that provides an output to a user. In one example, the display can include a touchscreen display. In one example, graphics interface 940 generates a display based on data stored in memory 930 or based on operations executed by processor 910 or both.

Memory subsystem 920 represents the main memory of system 900, and provides storage for code to be executed by processor 910, or data values to be used in executing a routine. Memory subsystem 920 can include one or more varieties of random-access memory (RAM) such as DRAM, 3DXP (three-dimensional crosspoint), or other memory devices, or a combination of such devices. Memory 930 stores and hosts, among other things, operating system (OS) 932 to provide a software platform for execution of instructions in system 900. Additionally, applications 934 can execute on the software platform of OS 932 from memory 930. Applications 934 represent programs that have their own operational logic to perform execution of one or more functions. Processes 936 represent agents or routines that provide auxiliary functions to OS 932 or one or more applications 934 or a combination. OS 932, applications 934, and processes 936 provide software logic to provide functions for system 900. In one example, memory subsystem 920 includes memory controller 922, which is a memory controller to generate and issue commands to memory 930. It will be understood that memory controller 922 could be a physical part of processor 910 or a physical part of interface 912. For example, memory controller 922 can be an integrated memory controller, integrated onto a circuit with processor 910, such as integrated onto the processor die or a system on a chip.

While not specifically illustrated, it will be understood that system 900 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 900 includes interface 914, which can be coupled to interface 912. Interface 914 can be a lower speed interface than interface 912. In one example, interface 914 represents an interface circuit, which can include standalone components and integrated circuitry. In one example, multiple user interface components or peripheral components, or both, couple to interface 914. Network interface 950 provides system 900 the ability to communicate with remote devices (e.g., servers or other computing devices) over one or more networks. Network interface 950 can include an Ethernet adapter, wireless interconnection components, cellular network interconnection components, USB (universal serial bus), or other wired or wireless standards-based or proprietary interfaces. Network interface 950 can exchange data with a remote device, which can include sending data stored in memory or receiving data to be stored in memory.

In one example, system 900 includes one or more input/output (I/O) interface(s) 960. I/O interface 960 can include one or more interface components through which a user interacts with system 900 (e.g., audio, alphanumeric, tactile/touch, or other interfacing). Peripheral interface 970 can include any hardware interface not specifically mentioned above. Peripherals refer generally to devices that connect dependently to system 900. A dependent connection is one where system 900 provides the software platform or hardware platform or both on which operation executes, and with which a user interacts.

In one example, system 900 includes storage subsystem 980 to store data in a nonvolatile manner. In one example, in certain system implementations, at least certain components of storage 980 can overlap with components of memory subsystem 920. Storage subsystem 980 includes storage device(s) 984, which can be or include any conventional medium for storing large amounts of data in a nonvolatile manner, such as one or more magnetic, solid state, NAND, 3DXP, or optical based disks, or a combination. Storage 984 holds code or instructions and data 986 in a persistent state (i.e., the value is retained despite interruption of power to system 900). Storage 984 can be generically considered to be a "memory," although memory 930 is typically the executing or operating memory to provide instructions to processor 910. Whereas storage 984 is nonvolatile, memory 930 can include volatile memory (i.e., the value or state of the data is indeterminate if power is interrupted to system 900). In one example, storage subsystem 980 includes controller 982 to interface with storage 984. In one example controller 982 is a physical part of interface 914 or processor 910, or can include circuits or logic in both processor 910 and interface 914.

Power source 902 provides power to the components of system 900. More specifically, power source 902 typically interfaces to one or multiple power supplies 904 in system 900 to provide power to the components of system 900. In one example, power supply 904 includes an AC to DC (alternating current to direct current) adapter to plug into a wall outlet. Such AC power can be renewable energy (e.g., solar power) power source 902. In one example, power source 902 includes a DC power source, such as an external AC to DC converter. In one example, power source 902 or power supply 904 includes wireless charging hardware to charge via proximity to a charging field. In one example, power source 902 can include an internal battery or fuel cell source.

Figure 10:
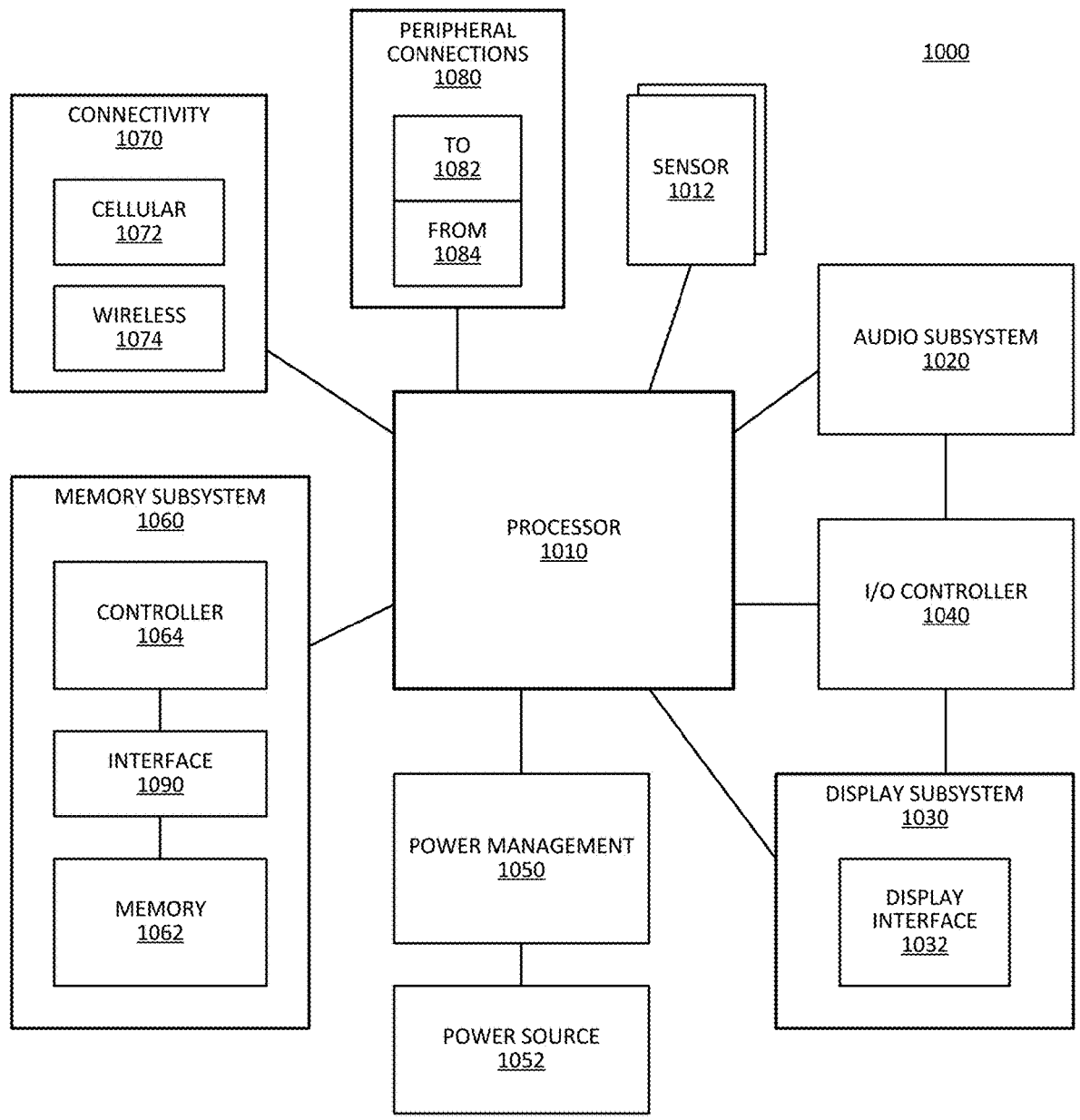
FIG. 10 is a block diagram of an example of a mobile device in which a memory module interface can be implemented.

FIG. 10 is a block diagram of an example of a mobile device in which a memory module interface can be implemented. System 1000 represents a mobile computing device, such as a computing tablet, a mobile phone or smartphone, wearable computing device, or other mobile device, or an embedded computing device. It will be understood that certain of the components are shown generally, and not all components of such a device are shown in system 1000.

System 1000 can include a memory module which holds memory subsystem 1060, which can be a module in accordance with any example herein, such system 100 or system 402 or system 504.

In one example, system 1000 includes interface 1090 to interconnect a module that holds memory 1062 with controller 1064. Controller 1064 is disposed on a system board that includes pins, pads, or connectors to connect with memory 1062 through interface 1090. Such a module with such an interface can be applied to other peripheral components of system 1000, to interconnect them to the system board. Interface 1090 represents an interconnection between a module and a system board in accordance with any example herein. In one example, interface 1090 represents an array of micro-springs to connect with the system board. In one example, the micro-springs include additional ground contacts to provide return paths for signal contacts. In one example, the module includes a top plate that has a composite material that provides stiffness and good thermal conductivity.

System 1000 includes processor 1010, which performs the primary processing operations of system 1000. Processor 1010 can be a host processor device. Processor 1010 can include one or more physical devices, such as microprocessors, application processors, microcontrollers, programmable logic devices, or other processing means. The processing operations performed by processor 1010 include the execution of an operating platform or operating system on which applications and device functions are executed. The processing operations include operations related to I/O (input/output) with a human user or with other devices, operations related to power management, operations related to connecting system 1000 to another device, or a combination. The processing operations can also include operations related to audio I/O, display I/O, or other interfacing, or a combination. Processor 1010 can execute data stored in memory. Processor 1010 can write or edit data stored in memory.

In one example, system 1000 includes one or more sensors 1012. Sensors 1012 represent embedded sensors or interfaces to external sensors, or a combination. Sensors 1012 enable system 1000 to monitor or detect one or more conditions of an environment or a device in which system 1000 is implemented. Sensors 1012 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 1012 can also include sensors for biometric systems such as fingerprint recognition systems, face detection or recognition systems, or other systems that detect or recognize user features. Sensors 1012 should be understood broadly, and not limiting on the many different types of sensors that could be implemented with system 1000. In one example, one or more sensors 1012 couples to processor 1010 via a frontend circuit integrated with processor 1010. In one example, one or more sensors 1012 couples to processor 1010 via another component of system 1000.

In one example, system 1000 includes audio subsystem 1020, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 1000, or connected to system 1000. In one example, a user interacts with system 1000 by providing audio commands that are received and processed by processor 1010.

Display subsystem 1030 represents hardware (e.g., display devices) and software components (e.g., drivers) that provide a visual display for presentation to a user. In one example, the display includes tactile components or touchscreen elements for a user to interact with the computing device. Display subsystem 1030 includes display interface 1032, which includes the particular screen or hardware device used to provide a display to a user. In one example, display interface 1032 includes logic separate from processor 1010 (such as a graphics processor) to perform at least some processing related to the display. In one example, display subsystem 1030 includes a touchscreen device that provides both output and input to a user. In one example, display subsystem 1030 includes a high definition (HD) or ultra-high definition (UHD) display that provides an output to a user. In one example, display subsystem includes or drives a touchscreen display. In one example, display subsystem 1030 generates display information based on data stored in memory or based on operations executed by processor 1010 or both.

I/O controller 1040 represents hardware devices and software components related to interaction with a user. I/O controller 1040 can operate to manage hardware that is part of audio subsystem 1020, or display subsystem 1030, or both. Additionally, I/O controller 1040 illustrates a connection point for additional devices that connect to system 1000 through which a user might interact with the system. For example, devices that can be attached to system 1000 might include microphone devices, speaker or stereo systems, video systems or other display device, keyboard or keypad devices, buttons/switches, or other I/O devices for use with specific applications such as card readers or other devices.

As mentioned above, I/O controller 1040 can interact with audio subsystem 1020 or display subsystem 1030 or both. For example, input through a microphone or other audio device can provide input or commands for one or more applications or functions of system 1000. Additionally, audio output can be provided instead of or in addition to display output. In another example, if display subsystem includes a touchscreen, the display device also acts as an input device, which can be at least partially managed by I/O controller 1040. There can also be additional buttons or switches on system 1000 to provide I/O functions managed by I/O controller 1040.

In one example, I/O controller 1040 manages devices such as accelerometers, cameras, light sensors or other environmental sensors, gyroscopes, global positioning system (GPS), or other hardware that can be included in system 1000, or sensors 1012. The input can be part of direct user interaction, as well as providing environmental input to the system to influence its operations (such as filtering for noise, adjusting displays for brightness detection, applying a flash for a camera, or other features).

In one example, system 1000 includes power management 1050 that manages battery power usage, charging of the battery, and features related to power saving operation. Power management 1050 manages power from power source 1052, which provides power to the components of system 1000. In one example, power source 1052 includes an AC to DC (alternating current to direct current) adapter to plug into a wall outlet. Such AC power can be renewable energy (e.g., solar power, motion based power). In one example, power source 1052 includes only DC power, which can be provided by a DC power source, such as an external AC to DC converter. In one example, power source 1052 includes wireless charging hardware to charge via proximity to a charging field. In one example, power source 1052 can include an internal battery or fuel cell source.

Memory subsystem 1060 includes memory device(s) 1062 for storing information in system 1000. Memory subsystem 1060 can include nonvolatile (state does not change if power to the memory device is interrupted) or volatile (state is indeterminate if power to the memory device is interrupted) memory devices, or a combination. Memory 1060 can store application data, user data, music, photos, documents, or other data, as well as system data (whether long-term or temporary) related to the execution of the applications and functions of system 1000. In one example, memory subsystem 1060 includes memory controller 1064 (which could also be considered part of the control of system 1000, and could potentially be considered part of processor 1010). Memory controller 1064 includes a scheduler to generate and issue commands to control access to memory device 1062.

Connectivity 1070 includes hardware devices (e.g., wireless or wired connectors and communication hardware, or a combination of wired and wireless hardware) and software components (e.g., drivers, protocol stacks) to enable system 1000 to communicate with external devices. The external device could be separate devices, such as other computing devices, wireless access points or base stations, as well as peripherals such as headsets, printers, or other devices. In one example, system 1000 exchanges data with an external device for storage in memory or for display on a display device. The exchanged data can include data to be stored in memory, or data already stored in memory, to read, write, or edit data.

Connectivity 1070 can include multiple different types of connectivity. To generalize, system 1000 is illustrated with cellular connectivity 1072 and wireless connectivity 1074. Cellular connectivity 1072 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), 5G, or other cellular service standards. Wireless connectivity 1074 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1080 include hardware interfaces and connectors, as well as software components (e.g., drivers, protocol stacks) to make peripheral connections. It will be understood that system 1000 could both be a peripheral device ("to" 1082) to other computing devices, as well as have peripheral devices ("from" 1084) connected to it. System 1000 commonly has a "docking" connector to connect to other computing devices for purposes such as managing (e.g., downloading, uploading, changing, synchronizing) content on system 1000. Additionally, a docking connector can allow system 1000 to connect to certain peripherals that allow system 1000 to control content output, for example, to audiovisual or other systems.

In addition to a proprietary docking connector or other proprietary connection hardware, system 1000 can make peripheral connections 1080 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In one aspect, an apparatus includes: a printed circuit board (PCB) including a component mounted on a surface of the PCB, the PCB including a contact layout; an interposer board having a first surface with a pad layout matching the contact layout to electrically interconnect to the component, and having a second surface with a pin layout matching the contact layout, the pin layout having compression-based pins to electrically interconnect to a system board; and a removable shield to secure the PCB and the interposer board to the system board, the removable shield to compress the compression-based pins of the pin layout of the interposer board, the removable shield being of a metal alloy including steel and copper.

In accordance with an example of the apparatus, in one example, the interposer board includes through-hole connections without routing from pads of the pad layout of the first surface to corresponding pins of the pin layout of the second surface. In accordance with any preceding example of the apparatus, in one example, the pad layout comprises a layout of electrical contacts to electrically connect to BGA (ball grid array) balls of the PCB, and wherein the compression-based pins comprise spring pins to electrically connect to pads on the system board. In accordance with any preceding example of the apparatus, in one example, the removable shield is to be secured with screws to the system board, connecting to a ground plane of the system board. In accordance with any preceding example of the apparatus, in one example, the apparatus includes: tabs on the PCB having a height approximately equal to a vertical dimension of the component, the tabs connected to a ground plane of the PCB, to electrically connect the removable shield to the ground plane of the PCB. In accordance with any preceding example of the apparatus, in one example, the contact layout of the PCB includes a first array of multiple columns of contacts, a second array of multiple columns of contacts, and a space between the first array and the second array without contacts, and wherein the pin layout matches the contact layout and includes a column of ground pins in the space between the first array and the second array, the column of ground pins not corresponding to a column of contacts in the contact layout of the PCB. In accordance with any preceding example of the apparatus, in one example, the component comprises a dynamic random access memory (DRAM) device. In accordance with any preceding example of the apparatus, in one example, the DRAM device comprises a low power double data rate (LPDDR) DRAM device, wherein the PCB includes multiple LPDDR DRAM devices, wherein the contact layout of the PCB includes contacts corresponding to contacts of the multiple LPDDR DRAM device, and wherein the pin layout of the interposer board includes pins corresponding to the contacts of the PCB.

In one aspect, a circuit board includes: a first printed circuit board (PCB) surface including a pad layout matching a contact layout of a memory device, to electrically interconnect to the memory device, wherein the contact layout of the memory device includes a first array of multiple columns of contacts, a second array of multiple columns of contacts, and a space between the first array and the second array without contacts; and a second PCB surface opposite the first PCB surface, the second PCB surface including a pin layout with columns of pins corresponding to the contact layout of the memory device, and including a column of ground pins in the space between the first array and the second array, the column of ground pins not corresponding to a column of contacts in the contact layout of the memory device, the pin layout to electrically interconnect to a system pad layout on a system board.

In accordance with an example of the circuit board, in one example, the circuit board includes through-hole connections without routing from pads of the pad layout of the first PCB surface to corresponding pins of the pin layout of the second PCB surface. In accordance with any preceding example of the circuit board, in one example, the pad layout comprises a layout of electrical contacts to electrically connect to BGA (ball grid array) balls of a component board, and wherein the pin layout comprises compression-based pins to electrically connect to pads on the system board. In accordance with any preceding example of the circuit board, in one example, the system board comprises a motherboard. In accordance with any preceding example of the circuit board, in one example, the memory device comprises a dynamic random access memory (DRAM) device. In accordance with any preceding example of the circuit board, in one example, the DRAM device comprises a low power double data rate (LPDDR) DRAM device, wherein the PCB includes multiple LPDDR DRAM devices, wherein the contact layout of the PCB includes contacts corresponding to contacts of the multiple LPDDR DRAM device, and wherein the pin layout includes pins corresponding to the contacts of the PCB.

In one aspect, a computer system includes: a system board including a system contact layout matching a contact layout of a memory device; a circuit board including: a first surface including a pad layout matching the contact layout of the memory device, to electrically interconnect to the memory device, wherein the contact layout of the memory device includes a first array of multiple columns of contacts, a second array of multiple columns of contacts, and a space between the first array and the second array without contacts; and a second surface opposite the first surface, the second surface including a pin layout with columns of pins corresponding to the contact layout of the memory device, and including a column of ground pins in the space between the first array and the second array, the column of ground pins not corresponding to a column of contacts in the contact layout of the memory device, the pin layout to electrically interconnect to the system contact layout.

In accordance with an example of the computer system, in one example, the computer system includes: a memory module including multiple memory devices, wherein the system board includes system contact layouts for each memory device of the memory module, and wherein the circuit board includes pad layouts for each of the memory devices of the memory module. In accordance with any preceding example of the computer system, in one example, the multiple memory devices comprise low power double data rate (LPDDR) dynamic random access memory (DRAM) devices. In accordance with any preceding example of the computer system, in one example, the pad layout comprises a layout of electrical contacts to electrically connect to BGA (ball grid array) balls of the memory device, and wherein the pin layout comprises compression-based pins to electrically connect to pads on the system board. In accordance with any preceding example of the computer system, in one example, the computer system includes: a removable shield to be secured to the system board with screws, connecting to a ground plane of the system board through the screws, the removable shield being of a metal alloy including steel and copper. In accordance with any preceding example of the computer system, in one example, the computer system includes: a memory module including multiple memory devices, wherein the system board includes system contact layouts for each memory device of the memory module, and wherein the circuit board includes pad layouts for each of the memory devices of the memory module; and tabs on the memory module having a height greater than a vertical dimension of the multiple memory devices, the tabs connected to a ground plane of the memory module, to electrically connect the removable shield to the ground plane of the memory module. In accordance with any preceding example of the computer system, in one example, the computer system includes one or more of: a host processor device mounted on the system board; a display communicatively coupled to a host processor of the system board; a network interface communicatively coupled to a host processor of the system board; or a battery to power the computer system.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. An apparatus, comprising:
    a printed circuit board (PCB) including a component mounted on a surface of the PCB, the PCB including a contact layout;
    an interposer board having a first surface with a pad layout matching the contact layout to electrically interconnect to the component, and having a second surface with a pin layout matching the contact layout, the pin layout having compression-based pins to electrically interconnect to a system board; and
    a removable shield to secure the PCB and the interposer board to the system board, the removable shield to compress the compression-based pins of the pin layout of the interposer board, the removable shield being of a metal alloy including steel and copper.

2. The apparatus of claim 1, wherein the interposer board includes through-hole connections without routing from pads of the pad layout of the first surface to corresponding pins of the pin layout of the second surface.

3. The apparatus of claim 2, wherein the pad layout comprises a layout of electrical contacts to electrically connect to BGA (ball grid array) balls of the PCB, and wherein the compression-based pins comprise spring pins to electrically connect to pads on the system board.

4. The apparatus of claim 1, wherein the removable shield is to be secured with screws to the system board, connecting to a ground plane of the system board.

5. The apparatus of claim 1, further comprising:
    tabs on the PCB having a height approximately equal to a vertical dimension of the component, the tabs connected to a ground plane of the PCB, to electrically connect the removable shield to the ground plane of the PCB.

6. The apparatus of claim 1, wherein the contact layout of the PCB includes a first array of multiple columns of contacts, a second array of multiple columns of contacts, and a space between the first array and the second array without contacts, and wherein the pin layout matches the contact layout and includes a column of ground pins in the space between the first array and the second array, the column of ground pins not corresponding to a column of contacts in the contact layout of the PCB.

7. The apparatus of claim 1, wherein the component comprises a dynamic random access memory (DRAM) device.

8. The apparatus of claim 7, wherein the DRAM device comprises a low power double data rate (LPDDR) DRAM device, wherein the PCB includes multiple LPDDR DRAM devices, wherein the contact layout of the PCB includes contacts corresponding to contacts of the multiple LPDDR DRAM device, and wherein the pin layout of the interposer board includes pins corresponding to the contacts of the PCB.

9. A circuit board, comprising:
a first printed circuit board (PCB) surface including a pad layout matching a contact layout of a memory device, to electrically interconnect to the memory device, wherein the contact layout of the memory device includes a first array of multiple columns of contacts, a second array of multiple columns of contacts, and a space between the first array and the second array without contacts; and
a second PCB surface opposite the first PCB surface, the second PCB surface including a pin layout with columns of pins corresponding to the contact layout of the memory device, and including a column of ground pins in the space between the first array and the second array, the column of ground pins not corresponding to a column of contacts in the contact layout of the memory device, the pin layout to electrically interconnect to a system pad layout on a system board.

10. The circuit board of claim 9, including through-hole connections without routing from pads of the pad layout of the first PCB surface to corresponding pins of the pin layout of the second PCB surface.

11. The circuit board of claim 9, wherein the pad layout comprises a layout of electrical contacts to electrically connect to BGA (ball grid array) balls of a component board, and wherein the pin layout comprises compression-based pins to electrically connect to pads on the system board.

12. The circuit board of claim 9, wherein the system board comprises a motherboard.

13. The circuit board of claim 9, wherein the memory device comprises a dynamic random access memory (DRAM) device.

14. The circuit board of claim 13, wherein the DRAM device comprises a low power double data rate (LPDDR) DRAM device, wherein the PCB includes multiple LPDDR DRAM devices, wherein the contact layout of the PCB includes contacts corresponding to contacts of the multiple LPDDR DRAM device, and wherein the pin layout includes pins corresponding to the contacts of the PCB.

15. A computer system comprising:
a system board including a system contact layout matching a contact layout of a memory device;
a circuit board including:
a first surface including a pad layout matching the contact layout of the memory device, to electrically interconnect to the memory device, wherein the contact layout of the memory device includes a first array of multiple columns of contacts, a second array of multiple columns of contacts, and a space between the first array and the second array without contacts; and
a second surface opposite the first surface, the second surface including a pin layout with columns of pins corresponding to the contact layout of the memory device, and including a column of ground pins in the space between the first array and the second array, the column of ground pins not corresponding to a column of contacts in the contact layout of the memory device, the pin layout to electrically interconnect to the system contact layout.

16. The computer system of claim 15, further comprising:
a memory module including multiple memory devices, wherein the system board includes system contact layouts for each memory device of the memory module, and wherein the circuit board includes pad layouts for each of the memory devices of the memory module.

17. The computer system of claim 16, wherein the multiple memory devices comprise low power double data rate (LPDDR) dynamic random access memory (DRAM) devices.

18. The computer system of claim 16, wherein the pad layout comprises a layout of electrical contacts to electrically connect to BGA (ball grid array) balls of the memory device, and wherein the pin layout comprises compression-based pins to electrically connect to pads on the system board.

19. The computer system of claim 15, further comprising:
a removable shield to be secured to the system board with screws, connecting to a ground plane of the system board through the screws, the removable shield being of a metal alloy including steel and copper.

20. The computer system of claim 19, further comprising:
a memory module including multiple memory devices, wherein the system board includes system contact layouts for each memory device of the memory module, and wherein the circuit board includes pad layouts for each of the memory devices of the memory module; and
tabs on the memory module having a height greater than a vertical dimension of the multiple memory devices, the tabs connected to a ground plane of the memory module, to electrically connect the removable shield to the ground plane of the memory module.

21. The computer system of claim 15, further comprising one or more of:
a host processor device mounted on the system board;
a display communicatively coupled to a host processor of the system board;
a network interface communicatively coupled to a host processor of the system board; or
a battery to power the computer system.

* * * * *